(12) United States Patent
Koyama et al.

(10) Patent No.: US 8,054,596 B2
(45) Date of Patent: Nov. 8, 2011

(54) SEMICONDUCTOR DEVICE

(75) Inventors: Jun Koyama, Kanagawa (JP);
Yoshifumi Tanada, Kanagawa (JP);
Hideaki Shishido, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/400,380

(22) Filed: Mar. 9, 2009

(65) Prior Publication Data

US 2009/0231021 A1    Sep. 17, 2009

(30) Foreign Application Priority Data

Mar. 14, 2008   (JP) .................................. 2008-065980

(51) Int. Cl.
*H02H 9/00* (2006.01)
*H01C 7/12* (2006.01)
*H02H 1/00* (2006.01)
*H02H 1/04* (2006.01)
*H02H 3/22* (2006.01)
*H02H 9/06* (2006.01)

(52) U.S. Cl. ........................................ 361/56; 361/118
(58) Field of Classification Search ................ 361/56
See application file for complete search history.

(56) References Cited

U.S. PATENT DOCUMENTS

| | | | |
|---|---|---|---|
| 5,414,442 A | 5/1995 | Yamazaki et al. | |
| 5,585,949 A | 12/1996 | Yamazaki et al. | |
| 5,936,231 A | 8/1999 | Michiyama et al. | |
| 6,799,015 B1 | 9/2004 | Tiwari | |
| 7,067,845 B2 | 6/2006 | Murakami et al. | |
| 7,224,560 B2 * | 5/2007 | May et al. | 361/56 |
| 7,259,429 B2 | 8/2007 | Yamazaki | |
| 7,274,543 B2 | 9/2007 | Nishikawa et al. | |
| 7,436,286 B2 | 10/2008 | Fischer et al. | |
| 7,471,188 B2 | 12/2008 | Koyama et al. | |
| 7,679,870 B2 * | 3/2010 | Lin et al. | 361/56 |
| 2006/0092591 A1 * | 5/2006 | Yuan et al. | 361/91.1 |
| 2007/0070562 A1 * | 3/2007 | Ma et al. | 361/56 |
| 2007/0080374 A1 | 4/2007 | Kurokawa | |
| 2007/0176176 A1 | 8/2007 | Yamazaki et al. | |
| 2008/0094180 A1 | 4/2008 | Kato et al. | |
| 2008/0101802 A1 * | 5/2008 | Yano | 398/202 |
| 2008/0143531 A1 | 6/2008 | Tadokoro | |
| 2008/0150475 A1 | 6/2008 | Kato et al. | |
| 2008/0156368 A1 | 7/2008 | Hirose et al. | |
| 2008/0174408 A1 | 7/2008 | Takahashi | |
| 2008/0237665 A1 | 10/2008 | Shishido | |
| 2008/0247208 A1 | 10/2008 | Fujita et al. | |
| 2009/0091872 A1 * | 4/2009 | Ueda | 361/91.1 |
| 2009/0230292 A1 | 9/2009 | Koyama et al. | |

FOREIGN PATENT DOCUMENTS

JP    2003-303890    10/2003

* cited by examiner

*Primary Examiner* — Dharti Patel
(74) *Attorney, Agent, or Firm* — Husch Blackwell LLP

(57) ABSTRACT

An element is protected without hampering an actual operation in the case where overvoltage that might damage the element is applied. A semiconductor device includes a first potential supply terminal 100; a second potential supply terminal 101; a protection circuit 107 which includes a voltage divider 102 electrically connected to the first potential supply terminal 100 and the second potential supply terminal 101, a control circuit 103, and a bypass circuit 106; and a functional circuit 108 which is electrically connected to the first potential supply terminal 100 and the second potential supply terminal 101 through the protection circuit 107.

23 Claims, 16 Drawing Sheets

SEMICONDUCTOR DEVICE

BACKGROUND OF THE INVENTION

1. Field of the Invention

The present invention relates to semiconductor devices.

2. Description of the Related Art

In recent years, electronic circuits (hereinafter referred to as functional circuits) which are formed over substrates and have specific functions have been utilized for a variety of electronic components or semiconductor devices such as electronic devices.

As functional circuits, photoelectric conversion circuits can be used, for example. A large number of semiconductor devices having photoelectric conversion circuits generally used for detecting electromagnetic waves (also referred to as photoelectric conversion devices) are known. For example, semiconductor devices having sensitivity to ultraviolet rays to infrared rays are generally referred to as optical sensors. Among optical sensors, an optical sensor having sensitivity to a visible light region with a wavelength greater than or equal to 400 nm and less than or equal to 700 nm is particularly referred to as a visible light sensor. A large number of visible light sensors are used for devices which need illuminance adjustment, on/off control, or the like depending on human living environment.

A semiconductor device having a functional circuit, for example, the above photoelectric conversion device, has a problem in that an element included in the circuit is damaged when high voltage which is higher than certain voltage is applied from the outside. For example, in the case of a photoelectric conversion device, it has a problem in that electrostatic discharge (ESD) occurs in a photoelectric conversion circuit when high voltage of several kilo volts is applied to the photoelectric conversion circuit by static electricity or the like. With respect to the above problems, a semiconductor device which has a function of suppressing damage to an element even if high voltage that might damage a functional circuit is applied from the outside by providing a protection circuit to lower voltage applied to the functional circuit has been proposed (for example, Reference 1: Japanese Published Patent Application No. 2003-303890).

SUMMARY OF THE INVENTION

However, a conventional semiconductor device including a protection circuit has a problem in that voltage necessary for the operation of an element cannot be obtained and that a normal operation cannot be performed in the case where an ordinary operation (also referred to as an actual operation) is to be performed though voltage applied to a functional circuit can be limited to a level within the necessary range with the protection circuit in the case where high voltage that might damage the element is applied from the outside. For example, in the case where high voltage that might damage the element is applied from the outside as in Reference 1, an external power supply terminal and a functional circuit (an integrated circuit in Reference 1) are brought out of conduction, so that the application of power supply voltage to the functional circuit is interrupted. Therefore, the semiconductor device has a problem in that the functional circuit cannot be operated during a period in which the application of power supply voltage is interrupted.

In view of the foregoing problems, it is an object of the present invention to protect an element without hampering an actual operation in the case where overvoltage that might damage the element is applied.

An embodiment of the present invention is a semiconductor device which includes a first potential supply terminal to which a first potential is applied, a second potential supply terminal to which a second potential is applied, a voltage divider for dividing voltage between the first potential supply terminal and the second potential supply terminal and generating a divided potential corresponding to the divided voltage, a control circuit for generating a control potential in accordance with the divided voltage, a bypass circuit including a resistor and a switching element electrically connected in parallel to the resistor, and a functional circuit including a first input terminal and a second input terminal. On/off of the switching element is controlled in accordance with the control potential. The first input terminal is electrically connected to the first potential supply terminal through the switching element and the resistor. The second input terminal is electrically connected to the second potential supply terminal.

An embodiment of the present invention is a semiconductor device which includes a first potential supply terminal to which a first potential is applied, a second potential supply terminal to which a second potential is applied, a voltage divider for dividing voltage between the first potential supply terminal and the second potential supply terminal and generating a divided potential corresponding to the divided voltage, a bypass circuit including a first resistor, a switching element, and a second resistor electrically connected to the first resistor through the switching element, and a functional circuit including a first input terminal and a second input terminal. On/off of the switching element is controlled in accordance with the divided potential. The first input terminal is electrically connected to the first potential supply terminal. The second input terminal is electrically connected to the second potential supply terminal and is electrically connected to the first potential supply terminal through the first resistor, the switching element, and the second resistor.

In this specification, a functional circuit refers to a circuit having a specific function. For example, the functional circuit includes an integrated circuit, a memory circuit, a pixel circuit of a display device, a photoelectric conversion circuit, a sensor circuit, and the like in its category.

In addition, in this specification, a transistor includes at least three terminals: a first terminal which serves as a control terminal, a second terminal, and a third terminal. The first terminal is a terminal for controlling the flow of current between the second terminal and the third terminal by the application of a control potential. For example, in a field-effect transistor, a first terminal refers to a gate electrode (including a region, a conductive film, a wiring, or the like which serves as a gate) or part or all of a portion which is electrically connected to the gate electrode. In addition, a second terminal refers to a source electrode (including a region, a conductive film, a wiring, or the like which serves as a source) or part or all of a portion which is electrically connected to the source electrode. Further, a third terminal refers to a drain electrode (including a region, a conductive film, a wiring, or the like which serves as a drain) or part or all of a portion which is electrically connected to the drain electrode.

Further, in this specification, since a second terminal and a third terminal of a transistor change depending on the structure, the operating condition, or the like of the transistor, it is difficult to define which is a second terminal or a third terminal. Therefore, in this document, one of terminals selected optionally from a second terminal and a third terminal is referred to one of the second terminal and the third terminal, and the other of the terminals is referred to as the other of the second terminal and the third terminal.

An embodiment of the present invention is a semiconductor device which includes a first potential supply terminal to which a first potential is applied, a second potential supply terminal to which a second potential is applied, a voltage divider, a control circuit, a bypass circuit, and a functional circuit including a first input terminal and a second input terminal. The second input terminal is electrically connected to the second potential supply terminal. The voltage divider includes a first resistor and a diode group including a plurality of diodes each having an anode and a cathode. The diode group includes diodes of N pieces (N is a natural number) of stages, which are formed using N pieces of diodes each having an anode and a cathode. An anode of a diode in a first stage is electrically connected to the first potential supply terminal through the first resistor. An anode of a diode in a $K^{th}$ stage (K is a natural number of any one of 2 to N−1) is electrically connected to a cathode of a diode in a K−$1^{th}$ stage. An anode of a diode in an $N^{th}$ stage is electrically connected to a cathode of a diode in an N−$1^{th}$ stage. A cathode of the diode in the $N^{th}$ stage is electrically connected to the second potential supply terminal. The control circuit includes a second resistor and a first transistor including a first terminal serving as a control terminal, a second terminal, and a third terminal. The first terminal of the first transistor is electrically connected to one cathode of diodes in 1 to $K^{th}$ stages. One of the second terminal and the third terminal of the first transistor is electrically connected to the first potential supply terminal through the second resistor. The other of the second terminal and the third terminal of the first transistor is electrically connected to the second potential supply terminal. The bypass circuit includes a third resistor and a second transistor including a first terminal serving as a control terminal, a second terminal, and a third terminal. The first terminal of the second transistor is electrically connected to the one of the second terminal and the third terminal of the first transistor. One of the second terminal and the third terminal of the second transistor is electrically connected to the first potential supply terminal. The other of the second terminal and the third terminal of the second transistor is electrically connected to the first input terminal of the functional circuit and is electrically connected to the first potential supply terminal through the third resistor.

Note that the semiconductor device of the above embodiment can further include a second bypass circuit. The control circuit can further include a fourth resistor and a third transistor including a first terminal serving as a control terminal, a second terminal, and a third terminal. The first terminal of the third transistor is electrically connected to the one of the second terminal and the third terminal of the first transistor. One of the second terminal and the third terminal of the third transistor is electrically connected to the first potential supply terminal through the fourth resistor. The other of the second terminal and the third terminal of the third transistor is electrically connected to the second potential supply terminal. The second bypass circuit can include a fifth resistor and a fourth transistor including a first terminal serving as a control terminal, a second terminal, and a third terminal. The first terminal of the fourth transistor is electrically connected to the one of the second terminal and the third terminal of the third transistor. One of the second terminal and the third terminal of the fourth transistor is electrically connected to the second potential supply terminal. The other of the second terminal and the third terminal of the fourth transistor is electrically connected to the second input terminal of the functional circuit and is electrically connected to the second potential supply terminal through the fifth resistor.

An embodiment of the present invention is a semiconductor device which includes a first potential supply terminal to which a first potential is applied, a second potential supply terminal to which a second potential is applied, a voltage divider, a bypass circuit, and a functional circuit including a first input terminal and a second input terminal. The first input terminal is electrically connected to the first potential supply terminal. The second input terminal is electrically connected to the second potential supply terminal. The voltage divider includes a first resistor and a diode group including a plurality of diodes each having an anode and a cathode. The diode group includes diodes of N pieces (N is a natural number) of stages, which are formed using N pieces of diodes each having an anode and a cathode. An anode of a diode in a first stage is electrically connected to the first potential supply terminal through the first resistor. An anode of a diode in a $K^{th}$ stage (K is a natural number of any one of 2 to N−1) is electrically connected to a cathode of a diode in a K−$1^{th}$ stage. An anode of a diode in an $N^{th}$ stage is electrically connected to a cathode of a diode in an N−$1^{th}$ stage. A cathode of the diode in the $N^{th}$ stage is electrically connected to the second potential supply terminal. The bypass circuit includes a second resistor, a third resistor, and a transistor including a first terminal serving as a control terminal, a second terminal, and a third terminal. The first terminal of the transistor is electrically connected to one of cathodes of diodes in 1 to $K^{th}$ stages. One of the second terminal and the third terminal of the transistor is electrically connected to the first potential supply terminal through the second resistor. The other of the second terminal and the third terminal of the transistor is electrically connected to the second potential supply terminal through the third resistor.

Note that in the semiconductor device of the above embodiment, the functional circuit is a photoelectric conversion circuit. The photoelectric conversion circuit can include a photoelectric conversion element whose cathode is electrically connected to the first input terminal, an output resistor, an amplifier circuit, and an output terminal. The amplifier circuit can include a reference transistor including a first terminal serving as a control terminal, a second terminal, and a third terminal, and an output transistor group including a first terminal serving as a control terminal, a second terminal, and a third terminal. The first terminal and one of the second terminal and the third terminal of the reference transistor are electrically connected to an anode of the photoelectric conversion element. The other of the second terminal and the third terminal of the reference transistor is electrically connected to the output terminal and is electrically connected to the second input terminal through the output resistor. The first terminal of the output transistor group is electrically connected to the first terminal of the reference transistor. One of the second terminal and the third terminal of the output transistor group is electrically connected to the first input terminal. The other of the second terminal and the third terminal of the output transistor group is electrically connected to the output terminal and is electrically connected to the second input terminal through the output resistor.

In addition, the semiconductor device of the above embodiment can further include a fourth diode including an anode and a cathode. The anode is electrically connected to the second potential supply terminal. The cathode is electrically connected to the first potential supply terminal.

Further, the transistor included in the semiconductor device of the above embodiment can be a thin film transistor.

Furthermore, the thin film transistor can be provided over a substrate having an insulating surface.

An element can be protected by a protection circuit without hampering an actual operation in the case where overvoltage that might damage the element is applied.

DETAILED DESCRIPTION OF THE INVENTION

Hereinafter, examples of embodiments of the present invention will be described with reference to the drawings. Note that the present invention is not limited to the following description. The present invention can be implemented in various different ways and it will be readily appreciated by those skilled in the art that various changes and modifications are possible without departing from the spirit and scope of the present invention. Therefore, the present invention should not be construed as being limited to the following description of the embodiments.

Embodiment 1

In this embodiment, a semiconductor device which is an embodiment of the present invention is described.

Figure 1:
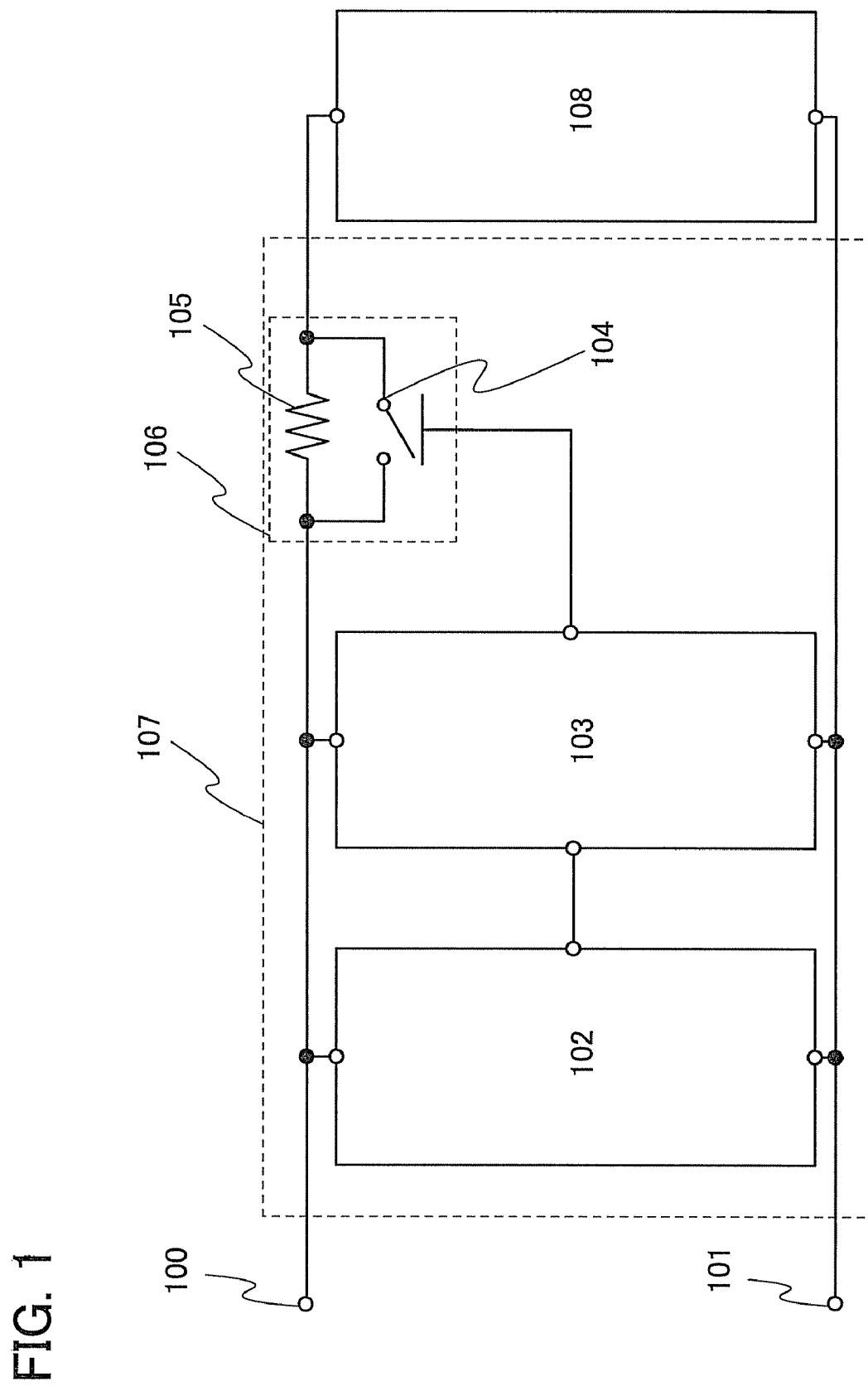
FIG. 1 is a block diagram illustrating a structural example of a semiconductor device of Embodiment 1.

First, the structure of a semiconductor device of this embodiment is described with reference to FIG. 1. FIG. 1 is a block diagram illustrating a structural example of the semiconductor device of this embodiment.

The semiconductor device illustrated in FIG. 1 includes a first potential supply terminal 100; a second potential supply terminal 101; protection circuit 107 which includes a voltage divider 102, a control circuit 103, and a bypass circuit 106 having a switching element 104 and a resistor 105; and a functional circuit 108 which includes a first input terminal and a second input terminal.

Note that in this specification, a bypass circuit refers to a circuit for forming an alternative path of an original path for supplying current.

The first potential supply terminal 100 and the second potential supply terminal 101 are electrically connected to the functional circuit 108 through the protection circuit 107.

In addition, in the protection circuit 107, the voltage divider 102 is electrically connected to the control circuit 103. Further, in the bypass circuit 106, the switching element 104 is electrically connected in parallel to the resistor 105. Furthermore, the first input terminal of the functional circuit 108 is electrically connected to the first potential supply terminal 100 through the bypass circuit 106, i.e., through the switching element 104 or the resistor 105, and the second input terminal of the functional circuit 108 is electrically connected to the second potential supply terminal 101.

The first potential supply terminal 100 is a terminal to which a relatively high-potential side potential (also simply referred to as a high potential) is applied from the outside in a normal condition. In addition, the second potential supply terminal 101 is a terminal to which a relatively low-potential side potential (also simply referred to as a low potential) is applied from the outside in a normal condition.

The protection circuit 107 is a circuit for suppressing the application of overvoltage to the functional circuit 108 by performing a protection operation. Here, overvoltage refers to voltage which greatly exceeds normal operating voltage and damages the functional circuit. Further, each circuit in the protection circuit 107 is described below.

In the voltage divider 102, applied voltage is divided and a divided potential is applied to the control circuit 103. Note that the voltage divider 102 can be formed by combining any of diodes, resistors, and the like, for example.

In the control circuit 103, a control potential is generated in accordance with the potential applied from the voltage divider 102. Note that the control circuit 103 can be formed by combining any of transistors, resistors, and the like, for example.

In the bypass circuit 106, a path for supplying current to the functional circuit is selected in accordance with the control potential applied from the control circuit 103. Specifically, in the bypass circuit 106, on/off of the switching element 104 is controlled in accordance with the control potential. By turning on or off the switching element 104 in accordance with the control potential, whether current is supplied mainly through the switching element 104 or mainly through the resistor 105 is selected, so that the level of power supply voltage applied to the functional circuit 108 is controlled.

Note that as the switching element 104 in the bypass circuit 106, a transistor can be used, for example. A thin film transistor (TFT) or the like including a non-single-crystal semiconductor film typified by amorphous silicon, polycrystalline silicon, microcrystalline (also referred to as microcrystal, nanocrystal, or semi-amorphous) silicon, or the like can be used as a transistor, for example. A TFT includes a gate terminal, a source terminal, and a drain terminal. In the case of using the TFT, a first terminal corresponds to the gate terminal, a second terminal corresponds to the source terminal, and a third terminal corresponds to the drain terminal. In addition, for example, a glass substrate or the like can be used as a substrate over which the TFT is provided, and an insulating substrate is preferably used. In the case of using the TFT as the switching element 104, there are various advantages. For example, since the TFT can be formed at a lower temperature than the case of using a transistor formed using single crystal silicon, a substrate having low heat resistance can be used. Further, in the case of using the TFT, since the TFT can be formed over a large substrate by using a large manufacturing apparatus for a transistor, the TFT can be formed at low cost. Furthermore, in the case of using the TFT, the TFT can be formed over a light-transmitting substrate.

Alternatively, a transistor using a semiconductor substrate, an SOI substrate, or the like can be used. Since a transistor using a semiconductor substrate, an SOI substrate, or the like has few variations in characteristics, sizes, shapes, or the like and has high current supply capability and a small size, power consumption of a circuit can be reduced or a circuit can be highly integrated.

Further, the polarity of the transistor is not particularly limited to a certain type. For example, an N-channel transistor or a P-channel transistor can be used.

The functional circuit 108 is a circuit having a specific function. As the functional circuit 108, an integrated circuit, a memory circuit, a pixel circuit of a display device, a photoelectric conversion circuit, a sensor circuit, or the like can be used, for example.

Figure 2:
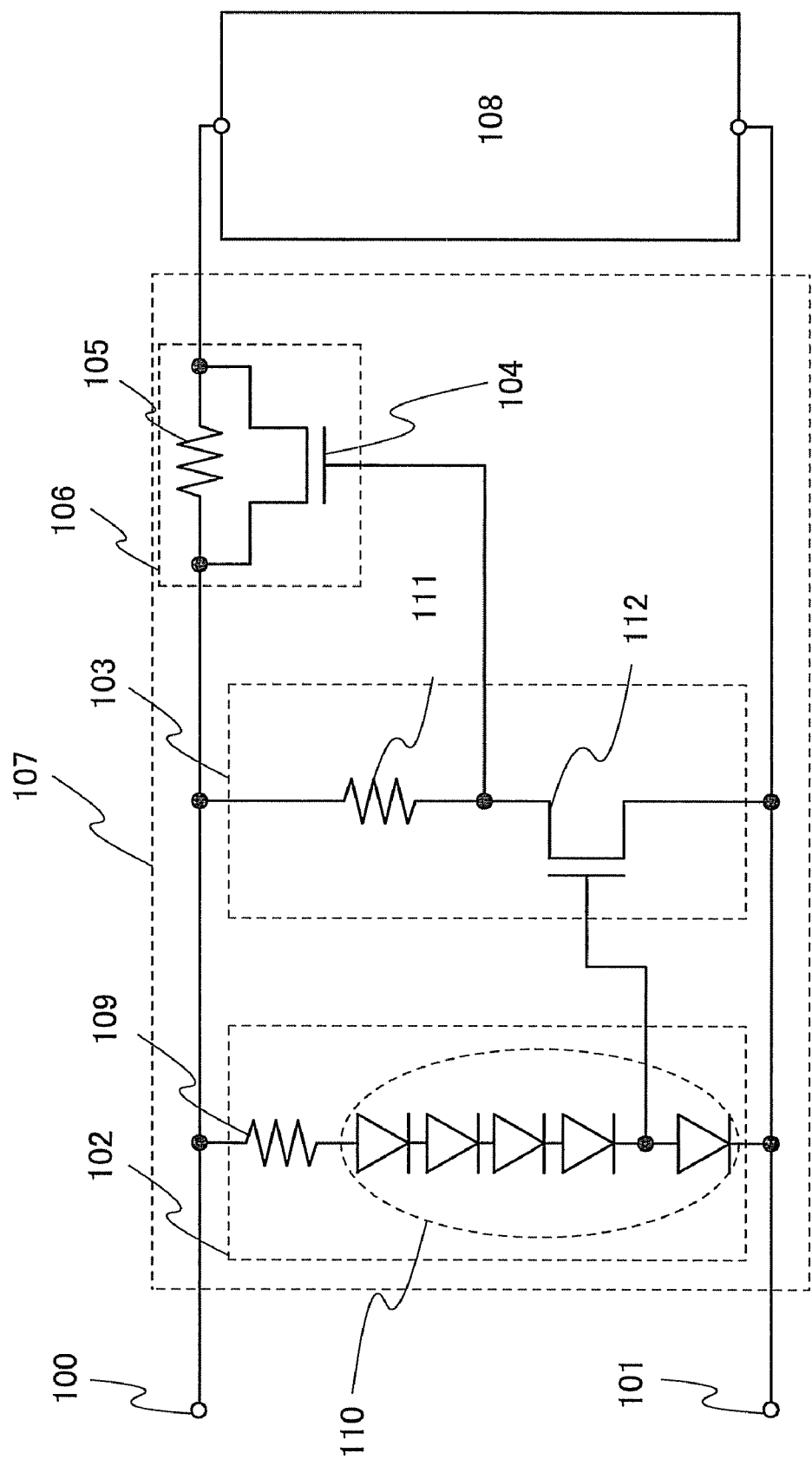
FIG. 2 is a circuit diagram illustrating a structural example of the semiconductor device of Embodiment 1.

Further, a more specific structure of the semiconductor device of this embodiment is described with reference to FIG. 2. FIG. 2 is a diagram illustrating a more specific structural example of the semiconductor device illustrated in FIG. 1.

The semiconductor device illustrated in FIG. 2 includes the first potential supply terminal 100; the second potential supply terminal 101; the protection circuit 107 which includes the voltage divider 102 having a resistor 109 and a diode group 110 including a plurality of diodes, the control circuit 103 having a resistor 111 and a transistor 112, and the bypass circuit 106 having the switching element 104 and the resistor 105; and the functional circuit 108 which includes the first input terminal and the second input terminal. Note that in FIG. 2, the case where a transistor is used for the switching element 104 in the bypass circuit 106 is described, for example.

Since the functions and structures of the first potential supply terminal 100, the second potential supply terminal 101, the bypass circuit 106 in the protection circuit 107, and the functional circuit 108 are similar to those of FIG. 1, description thereof is omitted.

In the voltage divider 102, the diode group 110 includes a plurality of diodes each having an anode and a cathode. The diodes are electrically connected in series.

In addition, the diode group 110 includes diodes of N pieces (N is a natural number) of stages, which are formed using N pieces of diodes each having an anode and a cathode. An anode of a diode in a first stage is electrically connected to the first potential supply terminal through the first resistor. An anode of a diode in a $K^{th}$ stage (K is a natural number of any one of 2 to N−1) is electrically connected to a cathode of a diode in a $K-1^{th}$ stage. An anode of a diode in an $N^{th}$ stage is electrically connected to a cathode of a diode in an $N-1^{th}$ stage. A cathode of the diode in the $N^{th}$ stage is electrically connected to the second potential supply terminal.

Note that in the diode group 110, the anode of the diode in the first stage (the anode of the diode in the first stage in FIG. 2) is also referred to as a first terminal of the diode group 110, and an output terminal of the diode in the $K^{th}$ stage (an output terminal of the diode in the fifth stage in FIG. 2) is also referred to as a second terminal of the diode group 110.

In addition, although a structure where diodes in 1 to $K^{th}$ stages are electrically connected in series as the diode group 110 is illustrated in FIG. 2, the structure of the diode group 110 is not limited to this. The number of diodes can be set as appropriate in accordance with the level of a necessary divided potential.

In the control circuit 103, a first terminal of the transistor 112 is electrically connected to one cathode of diodes in 1 to $K^{th}$ stages in the diode group 110 of the voltage divider 102. In the semiconductor device illustrated in FIG. 2, the first terminal of the transistor 112 is electrically connected to a cathode of the diode in the fourth stage of the diode group 110. Further, one of the second terminal and a third terminal of the transistor 112 is electrically connected to the first potential supply terminal 100 through the resistor 111. The other of the second terminal and the third terminal of the transistor 112 is electrically connected to the second potential supply terminal 101.

In the bypass circuit 106, a first terminal of the switching element 104 is electrically connected to the one of the second terminal and a third terminal of the transistor 112. One of a second terminal and a third terminal of the switching element 104 is electrically connected to the first potential supply terminal 100. The other of the second terminal and the third terminal of the switching element 104 is electrically connected to the first input terminal of the functional circuit 108 and is electrically connected to the first potential supply terminal 100 through the resistor 105.

Note that in the semiconductor device of this embodiment, the transistor 112 and a transistor which functions as the switching element 104 in FIG. 2 can have a same conductivity type.

In addition, in the semiconductor device of this embodiment, in addition to the structure in FIG. 2, a second bypass circuit having the same structure as the bypass circuit 106 can be provided in a connection portion of the second potential supply terminal 101 and the functional circuit 108.

Further, in the semiconductor device of this embodiment, in addition to the structure where the second bypass circuit is provided, a diode having an anode which is electrically connected to the second potential supply terminal 101 and a cathode which is electrically connected to the first potential supply terminal 100 and is electrically connected in parallel to the voltage divider 102 can be provided. With the diode, for example, the application of voltage to the functional circuit 108 can be controlled in each of the case where the first potential supply terminal 100 has a high potential and the second potential supply terminal 101 has a low potential and the case where the first potential supply terminal 100 has a low potential and the second potential supply terminal 101 has a high potential.

Next, the operations of the semiconductor device illustrated in FIG. 2 are described as an operation example of the semiconductor device of this embodiment. For example, the operations are described with the switching element 104 in FIG. 2 as an N-channel transistor and the transistor 112 as an N-channel transistor.

The operations of the semiconductor device of this embodiment can be divided into an operation in the case where power supply voltage within the necessary range is applied from the outside (in a normal condition) and an operation in the case where power supply voltage that might damage an element is applied from the outside (in the case where overvoltage is applied). Each case is described below.

First, the operation in the normal condition is described.

In the case where a potential within the necessary range is applied from the outside, a potential difference having a certain level is applied between the first potential supply terminal 100 and the second potential supply terminal 101. In the normal condition, a potential difference between the first potential supply terminal 100 and the second potential supply terminal 101 is referred to as first power supply voltage.

In the voltage divider 102, the first power supply voltage is divided, and a potential of a connection point (also referred to as a node) between the diode group 110 and the first terminal of the transistor 112 corresponds to the divided first power supply voltage. In this case, the potential of the node between the diode group 110 and the first terminal of the transistor 112 is referred to as a divided potential. Note that the level of the divided potential can be set as appropriate in accordance with the resistance value of the resistor 109, the level of the threshold voltage of each diode in the diode group 110 and the like.

In the control circuit 103, the transistor 112 is turned off in accordance with the divided potential. When the transistor 112 is off, a potential of a connection point (also referred to as a node) between the transistor 112 and the first terminal of the switching element 104 in the bypass circuit 106 is equivalent to a first potential applied through the first potential supply terminal 100. In this case, the potential of the node between the transistor 112 and the first terminal of the switching element 104 is referred to as a control potential. Note that the absolute value of the threshold voltage of the transistor 112 is preferably set to be larger than the absolute value of the divided potential in the normal condition. For example, the threshold voltage is preferably set to a level at which the transistor 112 is surely turned off in the normal condition.

In the bypass circuit 106, the switching element 104 is turned on in accordance with the control potential. When the switching element 104 is on, the first power supply voltage is applied to the functional circuit 108 through the switching element 104. In this case, since the switching element 104 is on, the resistor 105 can be ignored. Note that the absolute value of the threshold voltage of the switching element 104 is preferably set to be smaller than the absolute value of the control potential in the normal condition. For example, the threshold voltage is preferably set to a level at which the switching element 104 is surely turned on in the normal condition.

Next, in the functional circuit 108, a predetermined operation is performed with the applied first power supply voltage as power supply voltage of the functional circuit 108. The above is the operation in the normal condition.

Next, the operation in the case where overvoltage is applied is described.

In the case where overvoltage is applied from the outside, a high potential difference is applied between the first potential supply terminal 100 and the second potential supply terminal 101. In the case where overvoltage is applied, a potential difference between the first potential supply terminal 100 and the second potential supply terminal 101 is referred to as second power supply voltage.

In the voltage divider 102, the second power supply voltage is divided, and a potential of the connection point (also referred to as the node) between the diode group 110 and the first terminal of the transistor 112 is equivalent to the divided second power supply voltage. In this case, the potential of the node between the diode group 110 and the first terminal of the transistor 112 is referred to as a divided potential. Note that the level of the divided potential can be set as appropriate by setting the resistance value of the resistor 109, the level of the threshold voltage of each diode in the diode group 110 and the like.

In the control circuit 103, the transistor 112 is turned on in accordance with the divided potential. When the transistor 112 is on, a potential of the connection point (also referred to as the node) between the transistor 112 and the first terminal of the switching element 104 in the bypass circuit 106 is equivalent to a second potential applied through the second potential supply terminal 101. In this case, the potential of the node between the transistor 112 and the first terminal of the switching element 104 is referred to as a control potential. Note that the absolute value of the threshold voltage of the transistor 112 is preferably set to be smaller than the absolute value of the divided potential in the case where overvoltage that might damage the functional circuit, is applied. For example, the threshold voltage is preferably set to a level at which the transistor 112 is turned on in the case where overvoltage that might damage the functional circuit, is applied.

In the bypass circuit 106, the switching element 104 is turned off in accordance with the control potential. When the switching element 104 is off, current is supplied to the functional circuit 108 through the resistor 105. Thus, a load on the functional circuit 108 due to the supply of current from the outside can be relieved. The above is the operation in the case where overvoltage is applied.

As described above, in the semiconductor device of this embodiment, the element in the functional circuit can be protected without hampering an actual operation in the case where overvoltage that might damage the element in the functional circuit is applied.

Embodiment 2

In this embodiment, a semiconductor device having a structure which is different from that in Embodiment 1 is described.

Figure 3:
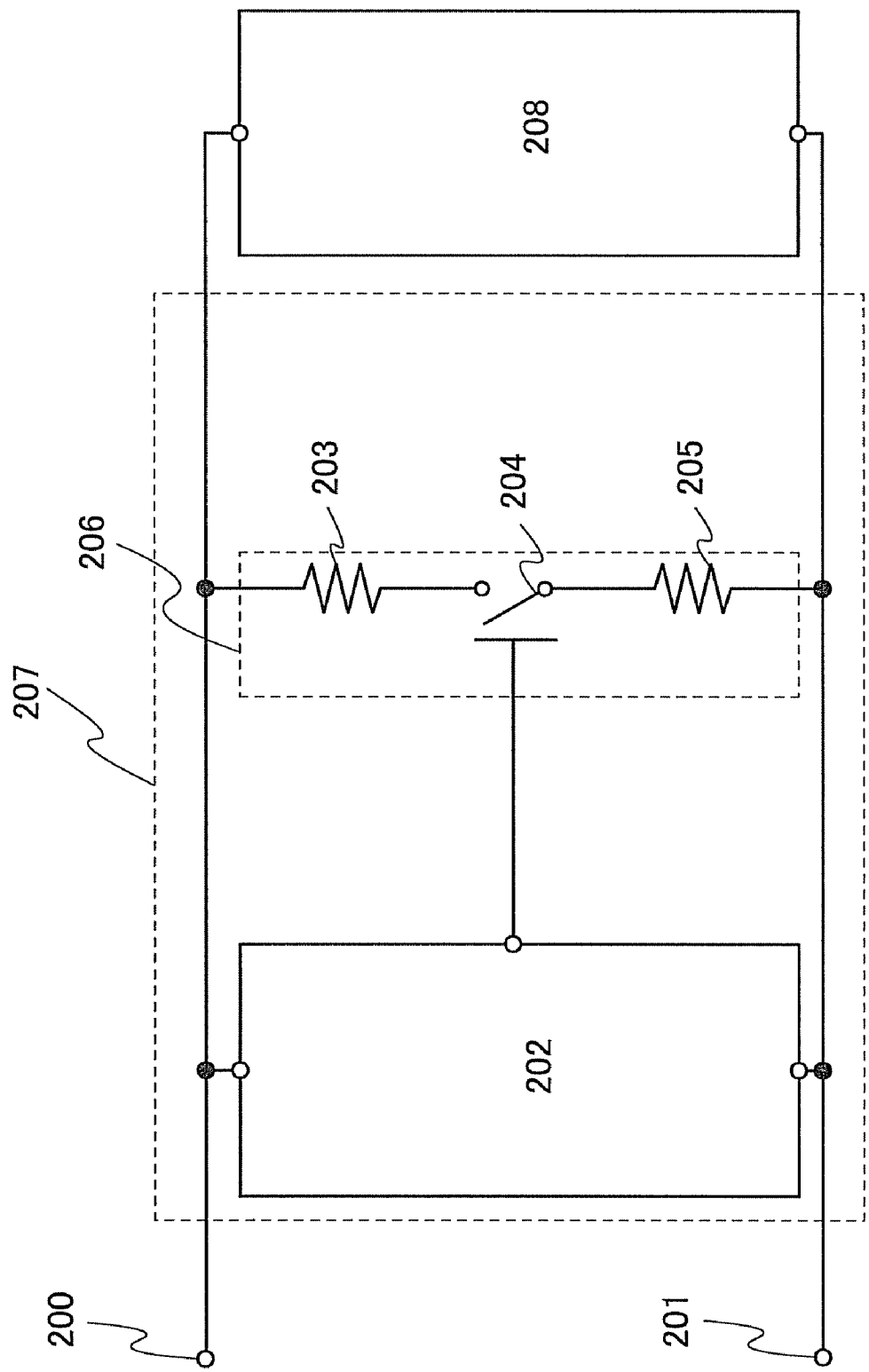
FIG. 3 is a block diagram illustrating a structural example of a semiconductor device of Embodiment 2.

First, a structural example of a semiconductor device of this embodiment is described with reference to FIG. 3. FIG. 3 is a block diagram illustrating a structural example of the semiconductor device of this embodiment.

The semiconductor device illustrated in FIG. 3 includes a first potential supply terminal 200; a second potential supply terminal 201; a protection circuit 207 which includes a voltage divider 202 and a bypass circuit 206 having a resistor 203, a switching element 204, and a resistor 205; and a functional circuit 208 which includes a first input terminal and a second input terminal.

The first potential supply terminal 200 and the second potential supply terminal 201 are electrically connected to the functional circuit 208 through the protection circuit 207.

In addition, in the protection circuit 207, the voltage divider 202 is electrically connected to the bypass circuit 206. Further, in the bypass circuit 206, the resistor 203 is electrically connected to the resistor 205 through the switching element 204. Furthermore, the first input terminal of the functional circuit 208 is electrically connected to the first potential supply terminal 200, and the second input terminal of the functional circuit 208 is electrically connected to the second potential supply terminal 201 and is electrically connected to the first potential supply terminal 200 through the resistor 203, the switching element 204, and the resistor 205.

The first potential supply terminal 200 is a terminal to which a relatively high-potential side potential (also simply referred to as a high potential) is applied from the outside in a normal condition. In addition, the second potential supply terminal 201 is a terminal to which a relatively low-potential side potential (also simply referred to as a low potential) is applied from the outside in a normal condition.

The protection circuit 207 is a circuit for suppressing the application of overvoltage to the functional circuit 208 by performing a protection operation. Each circuit in the protection circuit 207 is described below.

In the voltage divider 202, applied voltage is divided and a divided potential is applied to the bypass circuit 206. Note that the voltage divider 202 can be formed by combining any of diodes, resistors, and the like, for example.

In the bypass circuit 206, conduction/non-conduction of the first potential supply terminal 200 and the second potential supply terminal 201 is controlled in accordance with the divided potential applied from the voltage divider 202. Specifically, in the bypass circuit 206, on/off of the switching element 204 is controlled in accordance with the divided potential. By turning on or off the switching element 204 in accordance with the divided potential, the first potential supply terminal 200 and the second potential supply terminal 201 are brought into conduction or out of conduction through the resistor 203, the switching element 204, and the resistor 205.

Note that as the switching element 204 in the bypass circuit 206, a transistor or the like can be used, for example. A thin film transistor (TFT) or the like including a non-single-crystal semiconductor film typified by amorphous silicon, polycrystalline silicon, microcrystalline (also referred to as microcrystal, nanocrystal, or semi-amorphous) silicon, or the like can be used as the transistor, for example. A TFT includes a gate terminal, a source terminal, and a drain terminal. In the case of using the TFT, a first terminal corresponds to the gate terminal, a second terminal corresponds to the source terminal, and a third terminal corresponds to the drain terminal. In the case of using the TFT, there are various advantages. For example, since the TFT can be formed at a lower temperature than the case of using a transistor formed using single crystal silicon, a substrate having low heat resistance can be used. Further, in the case of using the TFT, since the TFT can be formed over a large substrate by using a large manufacturing apparatus for a transistor, the TFT can be formed at low cost. Furthermore, in the case of using the TFT, the TFT can be formed over a light-transmitting substrate.

Alternatively, a transistor using a semiconductor substrate, an SOI substrate, or the like can be used. Since a transistor using a semiconductor substrate, an SOI substrate, or the like has few variations in characteristics, sizes, shapes, or the like and has high current supply capability and a small size, power consumption of a circuit can be reduced or a circuit can be highly integrated.

Further, the polarity of the transistor is not particularly limited to a certain type. For example, an N-channel transistor or a P-channel transistor can be used.

The functional circuit 208 is a circuit having a specific function. As the functional circuit 208, an integrated circuit, a memory circuit, a pixel circuit of a display device, a photoelectric conversion circuit, a sensor circuit, or the like can be used, for example.

Figure 4:
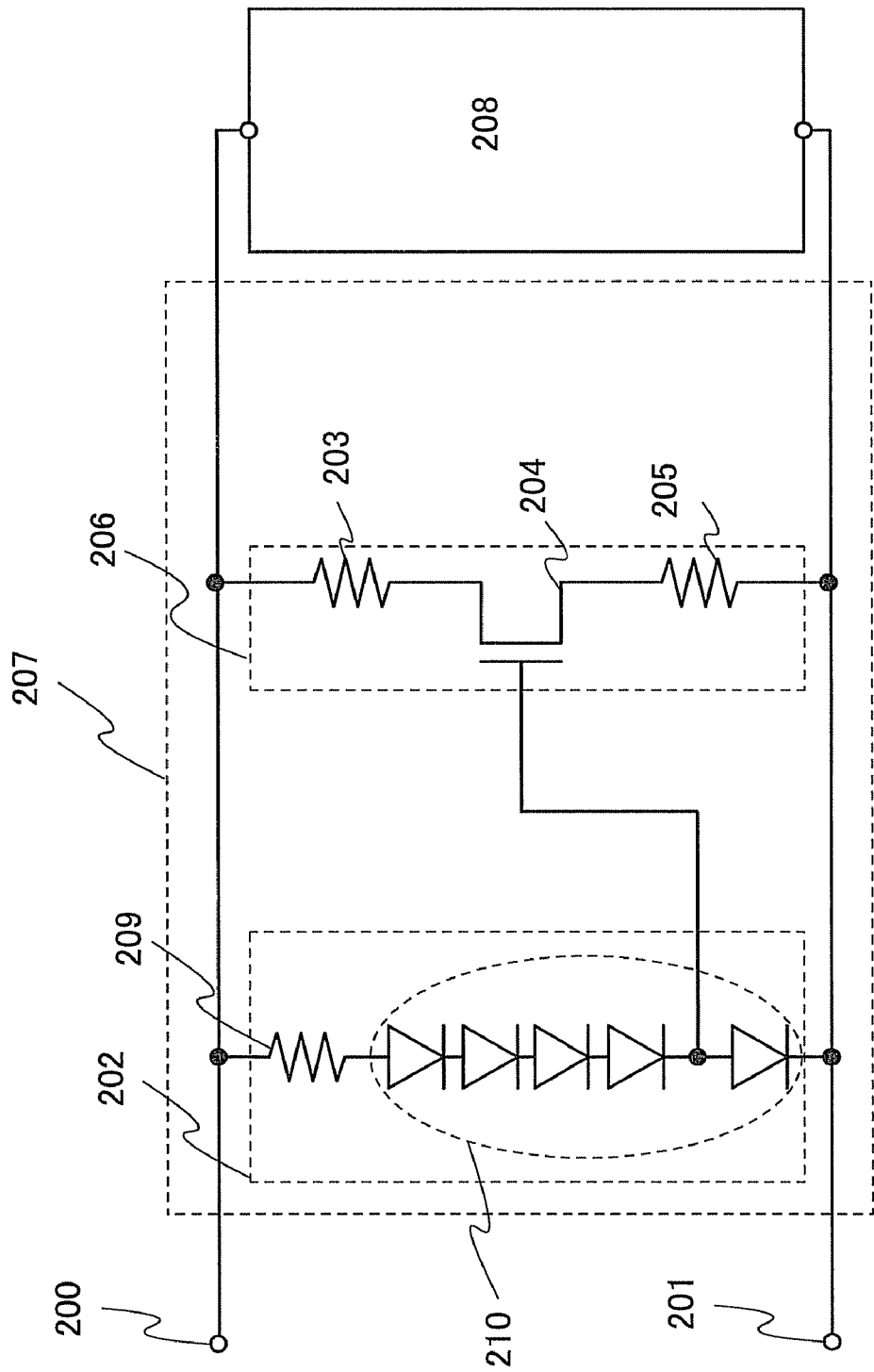
FIG. 4 is a circuit diagram illustrating a structural example of the semiconductor device of Embodiment 2.

Further, a more specific structural example of the semiconductor device illustrated in FIG. 3 is described with reference to FIG. 4. FIG. 4 is a diagram illustrating a more specific structure of the semiconductor device illustrated in FIG. 3.

The semiconductor device illustrated in FIG. 4 includes the first potential supply terminal 200; the second potential supply terminal 201; the protection circuit 207 which includes the voltage divider 202 having a resistor 209 and a diode group 210 including a plurality of diodes, the bypass circuit 206 having the resistor 203, the switching element 204, and the resistor 205; and the functional circuit 208 which includes the first input terminal and the second input terminal. Note that in FIG. 4, the case where a transistor is used for the switching element 204 is described, for example.

Since the functions and structures of the first potential supply terminal 200, the second potential supply terminal 201, the bypass circuit 206, and the functional circuit 208 are similar to those of the semiconductor device illustrated in FIG. 3, description thereof is omitted.

In the voltage divider 202, the diode group 210 includes a plurality of diodes each having an anode and a cathode. The diodes are electrically connected in series in the same direction.

In addition, the diode group 210 includes diodes of N (N is a natural number) pieces of stages, which are formed using N pieces of diodes each having an anode and a cathode. An anode of a diode in a first stage is electrically connected to the first potential supply terminal through the first resistor. An anode of a diode in a $K^{th}$ stage (K is a natural number of any one of 2 to N−1) is electrically connected to a cathode of a diode in a $K-1^{th}$ stage. An anode of a diode in an $N^{th}$ stage is electrically connected to a cathode of a diode in an $N-1^{th}$ stage. A cathode of the diode in the $N^{th}$ stage is electrically connected to the second potential supply terminal.

Note that in the diode group 210, the anode of the diode in the first stage (the anode of the diode in the first stage in FIG. 4) is also referred to as a first terminal of the diode group 210, and an output terminal of the diode in the $N^{th}$ stage (an output terminal of the diode in the fifth stage in FIG. 4) is also referred to as a second terminal of the diode group 210.

In addition, although a structure where five diodes are electrically connected in series as the diode group 210 is illustrated in FIG. 4, the structure of the diode group 210 is not limited to this. The number of diodes can be set as appropriate in accordance with the level of a necessary divided potential.

Further, in the semiconductor device of this embodiment, in addition to the structure of the semiconductor device illustrated in FIG. 3, a diode having an anode which is electrically connected to the second potential supply terminal 201 and a cathode which is electrically connected to the first potential supply terminal 200 and is electrically connected in parallel to the voltage divider 202 can be provided. With the diode, for example, the application of voltage to the functional circuit 208 can be controlled in each of the case where the first potential supply terminal 200 has a high potential and the second potential supply terminal 201 has a low potential and the case where the first potential supply terminal 200 has a low potential and the second potential supply terminal 201 has a high potential.

In the bypass circuit 206, a first terminal of the switching element 204 is electrically connected to one cathode of diodes in 1 to $K^{th}$ stages in the diode group 210 of the voltage divider 202. One of a second terminal and a third terminal of the switching element 204 is electrically connected to the first potential supply terminal 200 through the resistor 203. The other of the second terminal and the third terminal of the switching element 204 is electrically connected to the second potential supply terminal 201 through the resistor 205.

Next, the operations of the semiconductor device illustrated in FIG. 4 are described as an operation example of the semiconductor device of this embodiment. For example, the operations are described with the switching element 204 in FIG. 4 as an N-channel transistor.

The operations of the semiconductor device illustrated in FIG. 4 are divided into an operation in the case where a potential within the necessary range is applied from the outside (in a normal condition) and an operation in the case where an excessive high potential is applied from the outside (in the case where overvoltage is applied).

First, the operation in the normal condition is described.

In the case where a potential within the necessary range is applied from the outside, a potential difference having a certain level is applied between the first potential supply terminal 200 and the second potential supply terminal 201. In this case, voltage applied between the first potential supply terminal 200 and the second potential supply terminal 201 is referred to as first power supply voltage.

In the voltage divider 202, the first power supply voltage is divided, and a potential of a connection point (also referred to as a node) between the diode group 210 and the first terminal of the switching element 204 in the bypass circuit 206 corresponds to the divided first power supply voltage. In this case, the potential of the node between the diode group 210 and the first terminal of the switching element 204 is referred to as a divided potential. Note that the level of the divided potential can be set as appropriate in accordance with the resistance value of the resistor 209, the level of the threshold voltage of each diode in the diode group 210, and the like.

In the bypass circuit 206, the switching element 204 is turned off in accordance with the divided potential. When the switching element 204 is off, the first potential supply terminal 200 and the second potential supply terminal 201 are brought out of conduction and the first power supply voltage is applied to the functional circuit 208. In this case, the absolute value of the threshold voltage of the switching element 204 is preferably set to be larger than the absolute value of the divided potential in the normal condition. For example, the threshold voltage is preferably set to a level at which the switching element 204 is surely turned off in the normal condition.

Next, in the functional circuit 208, a predetermined operation is performed with the applied first power supply voltage as power supply voltage. The above is the operation in the normal condition.

Next, the operation in the case where overvoltage is applied is described.

In the case where high voltage that might damage an element is applied from the outside, a high potential difference is applied between the first potential supply terminal 200 and the second potential supply terminal 201. In the case where overvoltage is applied, voltage applied between the first potential supply terminal 200 and the second potential supply terminal 201 is referred to as second power supply voltage.

In the voltage divider 202, the second power supply voltage is divided, and a potential of the connection point (also referred to as the node) between the diode group 210 and the first terminal of the switching element 204 in the bypass circuit 206 corresponds to the divided second power supply voltage. In this case, the potential of the node between the diode group 210 and the first terminal of the switching element 204 is referred to as a divided potential. Note that the level of the divided potential can be set as appropriate by setting the resistance value of the resistor 209, the level of the threshold voltage of each diode in the diode group 210, and the like.

Next, in the bypass circuit 206, the switching element 204 is turned on in accordance with the divided potential applied to the first terminal of the switching element 204. When the switching element 204 is on, the first potential supply terminal 200 and the second potential supply terminal 201 are brought into conduction through the resistor 203, the switching element 204, and the resistor 205. When the first potential supply terminal 200 and the second potential supply terminal 201 are conducted, the bypass circuit 206 is a leak path and part of current corresponding to the second power supply voltage leaks. Thus, a load on the functional circuit 208 due to the supply of current from the outside can be relieved. In this case, the absolute value of the threshold voltage of the switching element 204 is preferably set to be smaller than the absolute value of the divided potential in the case where overvoltage that might damage the functional circuit, is applied. For example, the threshold voltage is preferably set to a level at which the switching element 204 is turned on in the case where overvoltage that might damage the functional circuit, is applied. The above is the operation in the case where overvoltage is applied.

As described above, in the semiconductor device of this embodiment, the element in the functional circuit can be protected without hampering an actual operation in the case where overvoltage that might damage the element in the functional circuit is applied.

In addition, in the semiconductor device of this embodiment, since current flows to the transistor through the resistors in the bypass circuit, deterioration of the transistor can be suppressed.

Further, since the semiconductor device of this embodiment can have a simpler structure than the semiconductor device illustrated in Embodiment 1, a circuit area can be reduced.

Note that this embodiment can be combined with any of other embodiments as appropriate.

Embodiment 3

In this embodiment, a semiconductor device including a photoelectric conversion circuit is described as an example of the semiconductor device illustrated in Embodiment 1.

Figure 5:
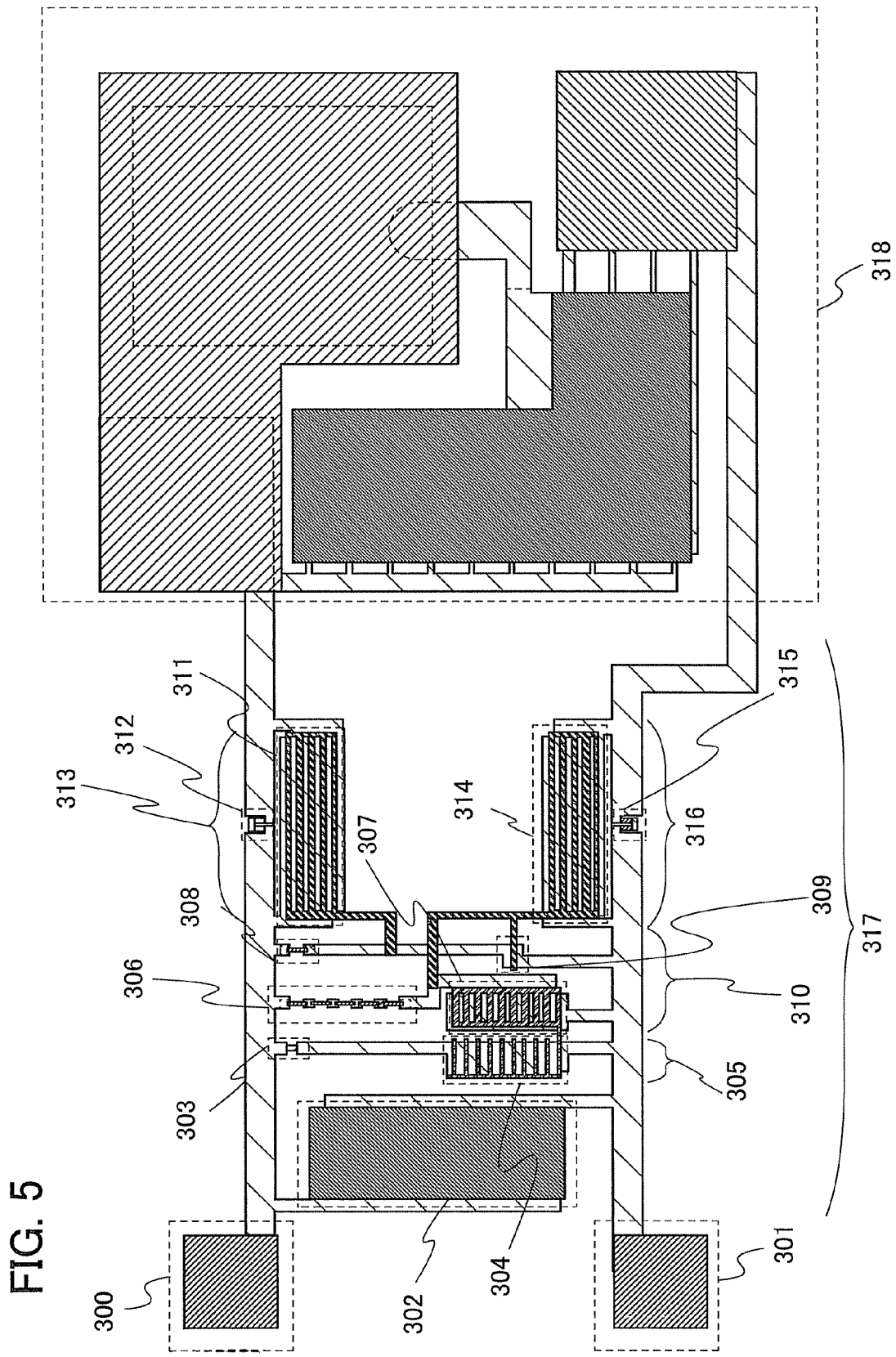
FIG. 5 is a top view illustrating a structural example of a semiconductor device of Embodiment 3.

First, a structural example of a semiconductor device of this embodiment is described with reference to FIG. 5. FIG. 5 is a top view illustrating a structural example of the semiconductor device of this embodiment.

The semiconductor device illustrated in FIG. 5 includes a first potential supply terminal 300; a second potential supply terminal 301; a protection circuit 317 which includes a diode 302, a voltage divider 305 having a resistor 303 and a diode group 304, a control circuit 310 having a resistor 306, a transistor 307, a resistor 308, and a transistor 309, a first bypass circuit 313 having a transistor 311 and a resistor 312, and a second bypass circuit 316 having a transistor 314 and a resistor 315; and a photoelectric conversion circuit 318 which includes a first input terminal and a second input terminal.

The first potential supply terminal 300 corresponds to the first potential supply terminal illustrated in Embodiment 1 (the first potential supply terminal 100 in FIG. 1 and FIG. 2) and has a function similar to that of the first potential supply terminal illustrated in Embodiment 1. In addition, the second potential supply terminal 301 corresponds to the second potential supply terminal illustrated in Embodiment 1 (the second potential supply terminal 101 in FIG. 1 and FIG. 2) and has a function similar to that of the second potential supply terminal illustrated in Embodiment 1.

The photoelectric conversion circuit 318 is an example of the functional circuit illustrated in Embodiment 1 (the functional circuit 108 in FIG. 1 and FIG. 2). A photoelectric conversion circuit refers to a circuit for generating current or voltage corresponding to the amount of light when light enters from the outside. For example, a photoelectric conversion circuit is used as an optical sensor or the like.

Figure 6:
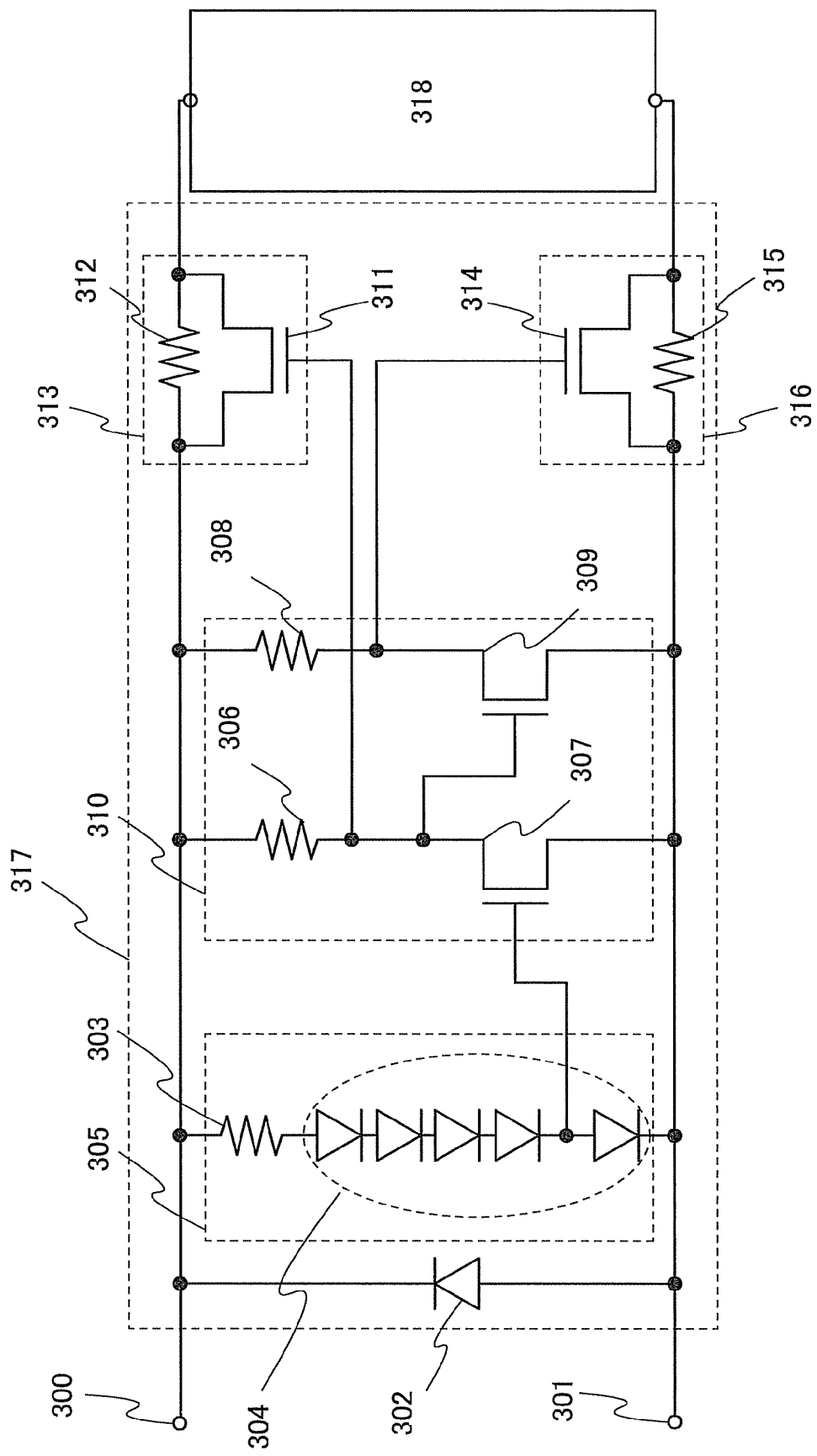
FIG. 6 is a circuit diagram illustrating a circuit structure of the semiconductor device illustrated in FIG. 5.

In addition, the circuit structure of the semiconductor device illustrated in FIG. 5 is described with reference to FIG. 6. FIG. 6 is a circuit diagram illustrating the circuit structure of the semiconductor device illustrated in FIG. 5.

The semiconductor device illustrated in FIG. 6 includes the first potential supply terminal 300; the second potential supply terminal 301; the protection circuit 317 which includes the diode 302, the voltage divider 305 having the resistor 303 and the diode group 304, the control circuit 310 having the resistor 306, the transistor 307, the resistor 308, and the transistor 309, the first bypass circuit 313 having the transistor 311 and the resistor 312, and the second bypass circuit 316 having the transistor 314 and the resistor 315; and the photoelectric conversion circuit 318 which includes the first input terminal and the second input terminal.

The diode 302 has an anode and a cathode. The anode of the diode 302 is electrically connected to the second potential supply terminal 301. The cathode of the diode 302 is electrically connected to the first potential supply terminal 300. With the diode 302, for example, the application of voltage to the photoelectric conversion circuit 318 can be controlled in each of the case where the first potential supply terminal 300 has a high potential and the second potential supply terminal 301 has a low potential and the case where the first potential supply terminal 300 has a low potential and the second potential supply terminal 301 has a high potential.

In the voltage divider 305, the diode group 304 includes a plurality of diodes each having an anode and a cathode. The diodes are electrically connected in series.

In addition, the diode group 304 includes diodes of N pieces of stages, which are formed using N pieces (N is a natural number) of diodes each having an anode and a cathode. An anode of a diode in a first stage is electrically connected to the first potential supply terminal through the first resistor. An anode of a diode in a $K^{th}$ stage (K is a natural number of any one of 2 to N−1) is electrically connected to a cathode of a diode in a K−$1^{th}$ stage. An anode of a diode in an $N^{th}$ stage is electrically connected to a cathode of a diode in an N−$1^{th}$ stage. A cathode of the diode in the $N^{th}$ stage is electrically connected to the second potential supply terminal.

Note that in the diode group 304, the anode of the diode in the first stage (the anode of the diode in the first stage in FIG. 6) is also referred to as a first terminal of the diode group 304, and an output terminal of the diode in the $N^{th}$ stage (an output terminal of the diode in the fifth stage in FIG. 6) is also referred to as a second terminal of the diode group 304.

In addition, although a structure where five diodes are electrically connected in series as the diode group 304 is illustrated in FIG. 6, the structure of the diode group 304 is not limited to this. The number of diodes can be set as appropriate in accordance with the level of a necessary divided potential.

In the control circuit 310, a first terminal of the transistor 307 is electrically connected to one cathode of diodes in 1 to $K^{th}$ stages in the diode group 304 of the voltage divider 305. One of a second terminal and a third terminal of the transistor 307 is electrically connected to the first potential supply terminal 300 through the resistor 306. The other of the second terminal and the third terminal of the transistor 307 is electrically connected to the second potential supply terminal 301.

Further, a first terminal of the transistor 309 is electrically connected to the one of the second terminal and the third terminal of the transistor 307. One of a second terminal and a third terminal of the transistor 309 is electrically connected to the first potential supply terminal 300 through the resistor 308. The other of the second terminal and the third terminal of the transistor 309 is electrically connected to the second potential supply terminal 301.

In the first bypass circuit 313, a first terminal of the transistor 311 is electrically connected to the one of the second terminal and the third terminal of the transistor 307 in the control circuit 310. One of a second terminal and a third terminal of the transistor 311 is electrically connected to the first potential supply terminal 300. The other of the second terminal and the third terminal of the transistor 311 is electrically connected to the first input terminal of the photoelectric conversion circuit 318 and is electrically connected to the first potential supply terminal 300 through the resistor 312.

In the second bypass circuit 316, a first terminal of the transistor 314 is electrically connected to the one of the second terminal and the third terminal of the transistor 309 in the control circuit 310. One of a second terminal and a third terminal of the transistor 314 is electrically connected to the second potential supply terminal 301. The other of the second terminal and the third terminal of the transistor 314 is electrically connected to the second input terminal of the photoelectric conversion circuit 318 and is electrically connected to the second potential supply terminal 301 through the resistor 315.

Figure 7:
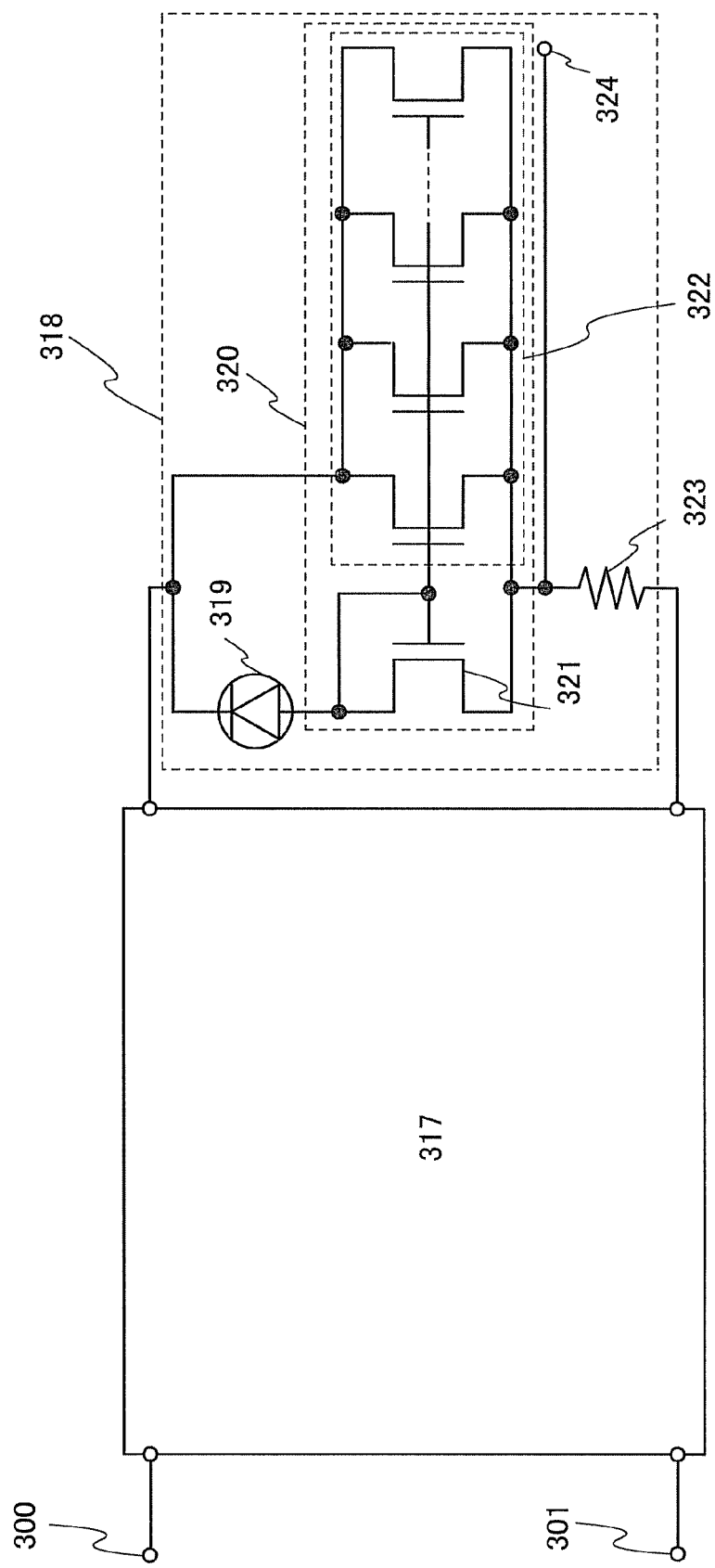
FIG. 7 is a circuit diagram illustrating a circuit structure of the semiconductor device illustrated in FIG. 5.

Next, a more specific structural example of the photoelectric conversion circuit 318 illustrated in FIG. 6 is described with reference to FIG. 7. FIG. 7 is a circuit diagram illustrating a structural example of the semiconductor device of this embodiment.

In the semiconductor device illustrated in FIG. 7, the photoelectric conversion circuit 318 can include a photoelectric conversion element 319, an amplifier circuit 320 formed using a current mirror circuit having a reference transistor 321 and an output transistor group 322, an output resistor 323, and an output terminal 324, for example.

The photoelectric conversion element 319 includes a first terminal (also referred to an anode) and a second terminal (also referred to a cathode). The second terminal of the photoelectric conversion element 319 is electrically connected to the first input terminal of the photoelectric conversion circuit 318.

A first terminal and one of a second terminal and a third terminal of the reference transistor 321 are electrically connected to the first terminal of the photoelectric conversion element 319. The other of the second terminal and the third terminal of the reference transistor 321 is electrically connected to the output terminal 324 and is electrically connected to the second input terminal of the photoelectric conversion circuit 318 through the output resistor 323.

A first terminal of the output transistor group 322 is electrically connected to the first terminal of the reference transistor 321. One of a second terminal and a third terminal of the output transistor group 322 is electrically connected to the first input terminal of the photoelectric conversion circuit 318. The other of the second terminal and the third terminal of the output transistor group 322 is electrically connected to the output terminal 324 and is electrically connected to the second input terminal of the photoelectric conversion circuit 318 through the output resistor 323.

In addition, the output transistor group 322 illustrated in FIG. 7 is formed using a plurality of transistors electrically connected in parallel to each other. The number of transistors can be set as appropriate. For example, by increasing the number of transistors, output current (photocurrent) of the photoelectric conversion element 319 is amplified in accordance with the number of transistors. For example, in the case where the output current of the photoelectric conversion element 319 is amplified 100-fold in the amplifier circuit 320, it is acceptable as long as the output transistor group 322 formed using hundred transistors is connected in parallel to one reference transistor 321.

Further, although one transistor is used as the reference transistor 321 in FIG. 7, the number of transistors is not limited to this. In the semiconductor device of this embodiment, the reference transistor 321 may be formed using a plurality of transistors. For example, by changing the number of transistors, the amplification factor of the amplifier circuit 320 can be approximately twice.

In the photoelectric conversion element 319, photocurrent corresponding to the illuminance of incident light is output.

Note that as the photoelectric conversion element 319, a photodiode, a phototransistor, or the like can be used, for example.

In the amplifier circuit 320, photocurrent which is output from the photoelectric conversion element 319 is amplified. Note that although an example in which a current mirror circuit is used for the amplifier circuit 320 is described in this embodiment, the structure of the amplifier circuit 320 is not limited to this. Any other circuit can be used as long as a similar operation can be performed.

Next, the operations of the semiconductor device illustrated in FIG. 6 and FIG. 7 are described. Note that for example, the operations are described with the transistors 307 and 309 in the control circuit 310 and the transistor 311 in the first bypass circuit 313 as N-channel transistors and with the transistor 314 in the second bypass circuit 316 as a P-channel transistor. In addition, a high potential is applied from the outside through the first potential supply terminal 300, and a low potential is applied from the outside through the second potential supply terminal 301.

The operations of the semiconductor device illustrated in FIG. 6 and FIG. 7 can be divided into an operation in the case where power supply voltage within the necessary range is applied from the outside (in a normal condition) and an operation in the case where power supply voltage that might damage an element is applied from the outside (in the case where overvoltage is applied). Each case is described below.

First, the operation in the normal condition is described.

In the case where a potential within the necessary range is applied from the outside, a potential difference having a certain level is applied between the first potential supply terminal 300 and the second potential supply terminal 301. In the normal condition, voltage applied between the first potential supply terminal 300 and the second potential supply terminal 301 is referred to as first power supply voltage.

In the voltage divider 305, the first power supply voltage is divided, and a potential of a connection point (also referred to as a node) between the diode group 304 and the first terminal of the transistor 307 corresponds to the divided first power supply voltage. In this case, the potential of the node between the diode group 304 and the first terminal of the transistor 307 is referred to as a divided potential. Note that the level of the divided potential can be set as appropriate in accordance with the resistance value of the resistor 303, the level of the threshold voltage of each diode in the diode group 304, and the like.

In the control circuit 310, the transistor 307 is turned off in accordance with the divided potential applied to the first terminal of the transistor 307. When the transistor 307 is off, a potential of a connection point (also referred to as a node) between the transistor 307 and the first terminal of the transistor 311 in the first bypass circuit 313 is equivalent to a first potential applied through the first potential supply terminal 300. In this case, the potential of the node between the transistor 307 and the first terminal of the transistor 311 is referred to as a first control potential.

In addition, in the control circuit 310, the transistor 309 is turned on in accordance with the first control potential. When the transistor 309 is on, a potential of a connection point (also referred to as a node) between the transistor 309 and the first terminal of the transistor 314 in the second bypass circuit 316 is equivalent to a second potential applied through the second potential supply terminal 301. In this case, the potential of the node between the transistor 309 and the first terminal of the transistor 314 is referred to as a second control potential. Note that the absolute value of the threshold voltage of the transistor 307 is preferably set to be larger than the absolute value of the divided potential in the normal condition. For example, the threshold voltage is preferably set to a level at which the transistor 307 is surely turned off in the normal condition. Further, the absolute value of the threshold voltage of the transistor 309 is preferably set to be smaller than the absolute value of the first control potential in the normal condition. For example, the threshold voltage is preferably set to a level at which the transistor 309 is surely turned on in the normal condition.

In the first bypass circuit 313, the transistor 311 is turned on in accordance with the first control potential. In addition, in the second bypass circuit 316, the transistor 314 is turned on in accordance with the second control potential. When the transistors 311 and 314 are on, the first power supply voltage is applied to the photoelectric conversion circuit 318. In this case, since the transistors 311 and 314 are on, the resistors 312 and 315 can be ignored. Note that the absolute value of the threshold voltage of the transistor 311 is preferably set to be smaller than the absolute value of the first control potential in the normal condition. For example, the threshold voltage is preferably set to a level at which the transistor 311 is surely turned on in the normal condition. Further, the absolute value of the threshold voltage of the transistor 314 is preferably set to be smaller than the absolute value of the second control potential in the normal condition. For example, the threshold voltage is preferably set to a level at which the transistor 314 is surely turned on in the normal condition.

In the photoelectric conversion circuit 318, a current-voltage conversion operation is performed with the first power supply voltage as power supply voltage. The current-voltage conversion operation is described below.

Since a potential of the reference transistor 321 and a potential of the first terminal of the output transistor group 322 in the amplifier circuit 320 are equivalent to each other, current supplied to the output transistor group 322 is controlled with current supplied to the reference transistor 321 as a reference.

Photocurrent detected in the photoelectric conversion element 319 is converted into voltage in accordance with its relationship with the output resistor 323. The converted voltage is output outside through the output terminal 324 as output voltage. In this case, the level of the output voltage is expressed as $V = I \times R$ by Ohm's law, where the current which is obtained by amplifying photocurrent detected in the photoelectric conversion element 319 by the amplifier circuit 320 is denoted by I and the resistance value of the output resistor 323 is denoted by R. The above is the operation in the normal condition.

Next, the operation in the case where overvoltage is applied is described.

In the case where overvoltage is applied from the outside, a high potential difference is applied between the first potential supply terminal 300 and the second potential supply terminal 301. In the case where overvoltage is applied, voltage applied between the first potential supply terminal 300 and the second potential supply terminal 301 is referred to as second power supply voltage.

In the voltage divider 305, the second power supply voltage is divided, and a potential of the connection point (also referred to as the node) between the diode group 304 and the first terminal of the transistor 307 in the control circuit 310 corresponds to the divided second power supply voltage. In this case, the potential of the node between the diode group 304 and the first terminal of the transistor 307 is referred to as a divided potential. Note that the level of the divided potential can be set as appropriate by setting the resistance value of the resistor 303, the level of the threshold voltage of each diode in the diode group 304, and the like.

In the control circuit 310, the transistor 307 is turned on in accordance with the divided potential. When the transistor 307 is on, a potential of the connection point (also referred to as the node) between the transistor 307 and the first terminal of the transistor 311 in the first bypass circuit 313 is equivalent to a second potential applied through the second potential supply terminal 301. In this case, the potential of the node between the transistor 307 and the first terminal of the transistor 311 is referred to as a first control potential. Note that the absolute value of the threshold voltage of the transistor 307 is preferably set to be smaller than the absolute value of the divided potential in the case where overvoltage that might damage the functional circuit, is applied. For example, the threshold voltage is preferably set to a level at which the transistor 307 is turned on in the case where overvoltage that might damage the functional circuit, is applied.

Further, in the control circuit 310, the transistor 309 is turned off in accordance with the first control potential. When the transistor 309 is off, a potential of the connection point (also referred to as the node) between the transistor 309 and the first terminal of the transistor 314 in the second bypass circuit 316 is equivalent to a first potential applied through the first potential supply terminal 300. In this case, the potential of the node between the transistor 309 and the first terminal of the transistor 314 is referred to as a second control potential. Note that the absolute value of the threshold voltage of the transistor 309 is preferably set to be larger than the absolute value of the divided potential in the case where overvoltage that might damage the functional circuit, is applied. For example, the threshold voltage is preferably set to a level at which the transistor 309 is turned off in the case where overvoltage that might damage the functional circuit, is applied.

In the first bypass circuit 313, the transistor 311 is turned off in accordance with the first control potential. In addition, in the second bypass circuit 316, the transistor 314 is turned off in accordance with the second control potential. When the transistors 311 and 314 are off, current is supplied to the photoelectric conversion circuit 318 through the resistor 312 and the resistor 315. Thus, a load on the photoelectric conversion circuit 318 due to the supply of current from the outside can be relieved. In this case, the absolute value of the threshold voltage of each of the transistors 311 and 314 is preferably set to be larger than the absolute value of the control potential in the case where overvoltage that might damage the functional circuit, is applied. For example, the threshold voltage is preferably set to a level at which the transistors 311 and 314 are turned off in the case where overvoltage that might damage the functional circuit, is applied.

In the photoelectric conversion circuit 318, a current-voltage conversion operation is performed using the applied power supply voltage. Note that since the current-voltage conversion operation is the same as that in the normal condition, description thereof is omitted. The above is the operation in the case where overvoltage is applied.

As described above, in the semiconductor device of this embodiment, the element in the photoelectric conversion circuit can be protected without hampering an actual operation in the case where overvoltage that might damage the element in the photoelectric conversion circuit is applied.

Specifically, in the photoelectric conversion circuit, even if overvoltage due to static electricity is applied to the transistor in the amplifier circuit, which has relatively lower withstand voltage than a photoelectric conversion element, damage to the transistor in the amplifier circuit can be suppressed.

Note that this embodiment can be combined with any of other embodiments as appropriate.

Embodiment 4

In this embodiment, a semiconductor device including a photoelectric conversion circuit is described as an example of the semiconductor device illustrated in Embodiment 2.

Figure 8:
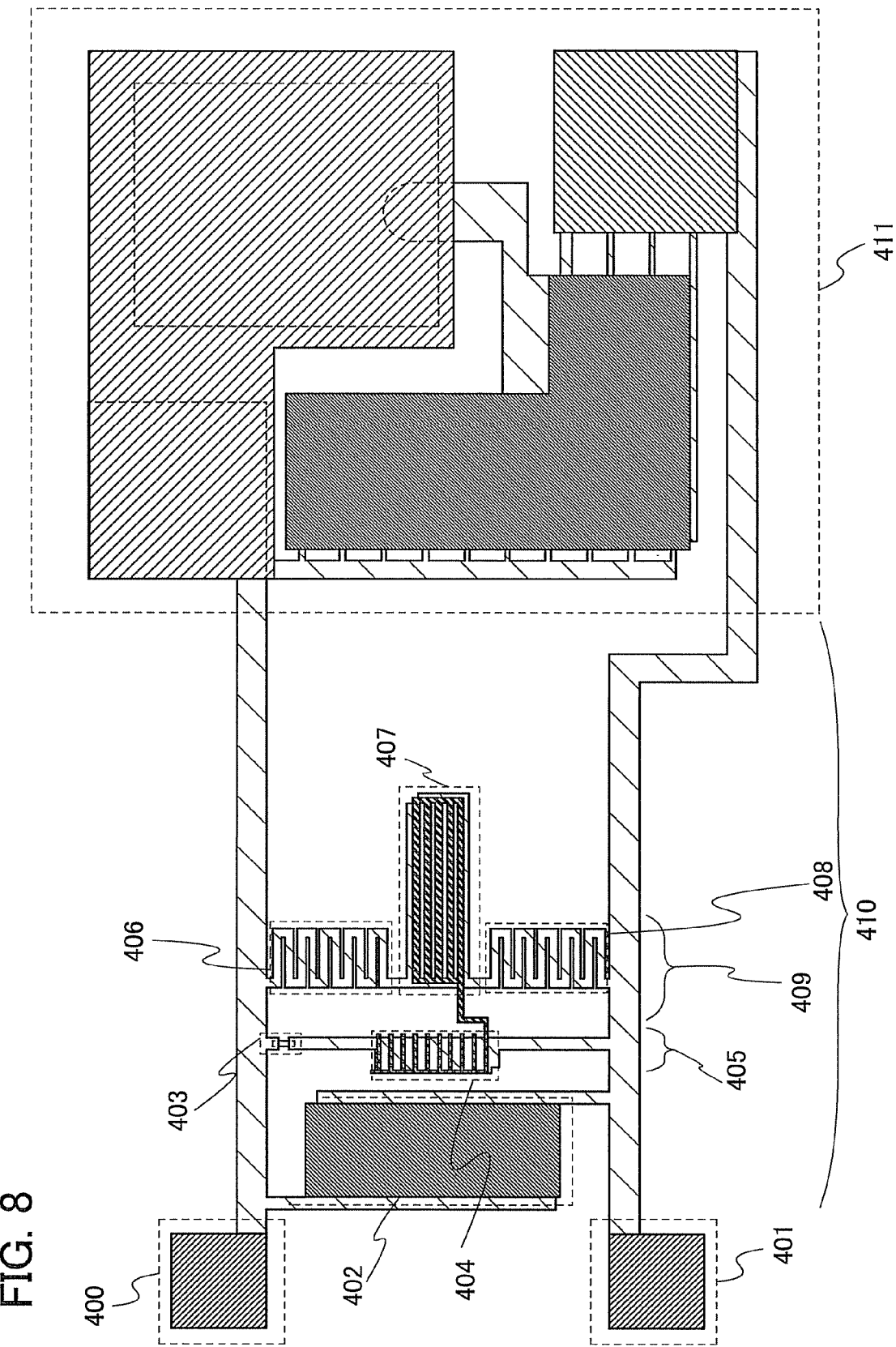
FIG. 8 is a top view illustrating a structural example of a semiconductor device of Embodiment 4.

First, a structural example of a semiconductor device of this embodiment is described with reference to FIG. 8. FIG. 8 is a top view illustrating the structure of the semiconductor device of this embodiment.

The semiconductor device illustrated in FIG. 8 includes a first potential supply terminal 400; a second potential supply terminal 401; a protection circuit 410 which includes a diode 402, a voltage divider 405 having a resistor 403 and a diode group 404, and a bypass circuit 409 having a resistor 406, a transistor 407, and a resistor 408; and a photoelectric conversion circuit 411 which includes a first input terminal and a second input terminal.

The first potential supply terminal 400 corresponds to the first potential supply terminal illustrated in Embodiment 2 (the first potential supply terminal 200 in FIG. 3 and FIG. 4) and has a function similar to that of the first potential supply terminal illustrated in Embodiment 2. In addition, the second potential supply terminal 401 corresponds to the second potential supply terminal illustrated in Embodiment 2 (the second potential supply terminal 201 in FIG. 3 and FIG. 4) and has a function similar to that of the second potential supply terminal illustrated in Embodiment 2.

The protection circuit 410 corresponds to the protection circuit illustrated in Embodiment 2 (the protection circuit 207 in FIG. 3 and FIG. 4) with adding a diode 402 and has a function similar to that of the protection circuit illustrated in Embodiment 2. A function or a structure which can be used for the protection circuit illustrated in Embodiment 2 can be used.

The photoelectric conversion circuit 411 corresponds to the photoelectric conversion circuit illustrated in Embodiment 3 (the photoelectric conversion circuit 318 in FIG. 5, FIG. 6, and FIG. 7) and has a function similar to that of the photoelectric conversion circuit illustrated in Embodiment 3. A structure which can be used for the photoelectric conversion circuit illustrated in Embodiment 3 can be used.

Figure 9:
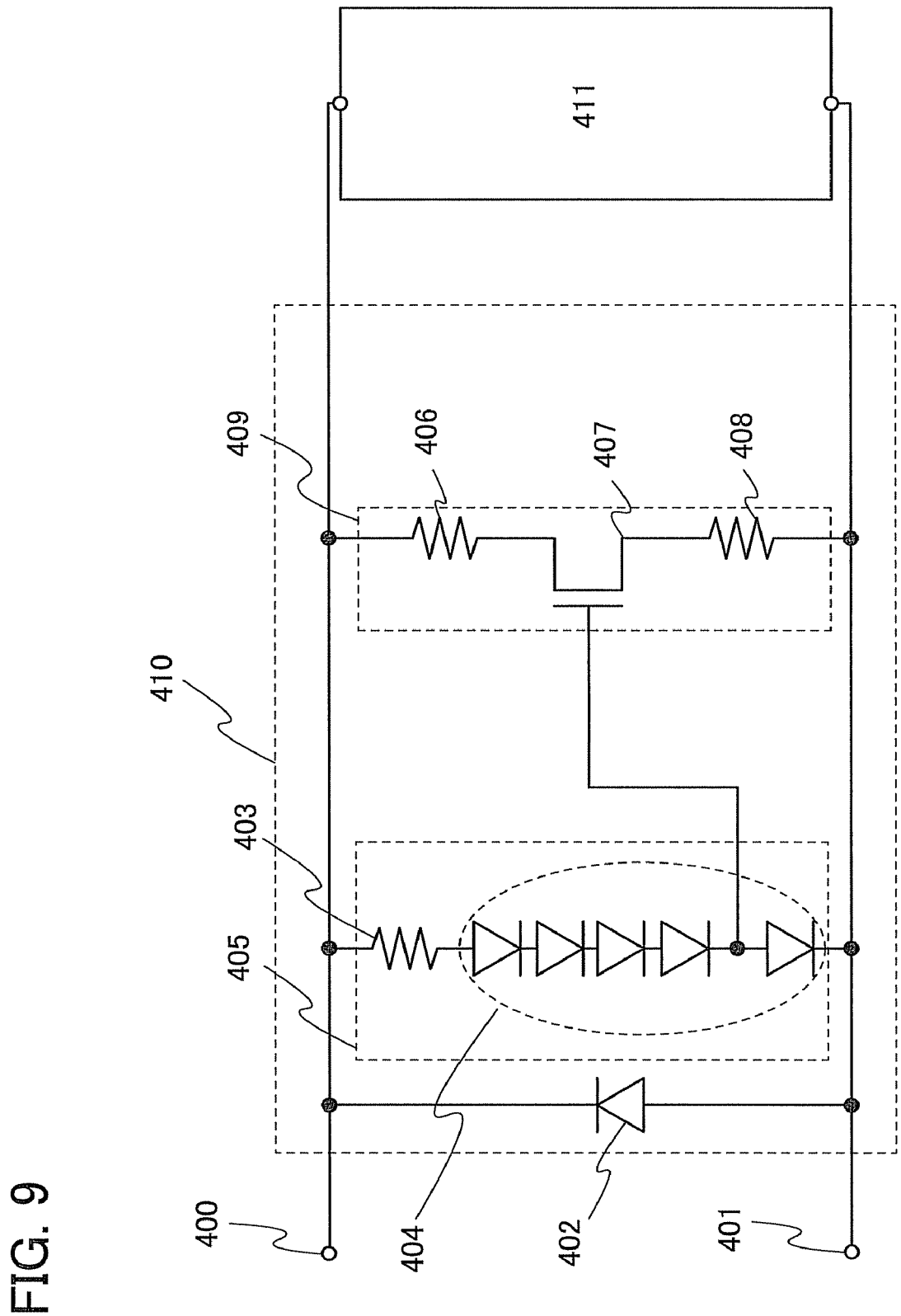
FIG. 9 is a circuit diagram illustrating a circuit structure of the semiconductor device illustrated in FIG. 8.

In addition, the circuit structure of the semiconductor device illustrated in FIG. 8 is described with reference to FIG. 9. FIG. 9 is a circuit diagram illustrating the circuit structure of the semiconductor device illustrated in FIG. 8.

The semiconductor device illustrated in FIG. 9 includes the first potential supply terminal 400; the second potential supply terminal 401; the protection circuit 410 which includes the diode 402, the voltage divider 405 having the resistor 403 and the diode group 404, and the bypass circuit 409 having the resistor 406, the transistor 407, and the resistor 408; and the photoelectric conversion circuit 411 which includes the first input terminal and the second input terminal.

The diode 402 has an anode and a cathode. The anode of the diode 402 is electrically connected to the second potential supply terminal 401. The cathode of the diode 402 is electrically connected to the first potential supply terminal 400. With the diode 402, for example, the application of voltage to the photoelectric conversion circuit 411 can be controlled in each of the case where the first potential supply terminal 400 has a high potential and the second potential supply terminal 401 has a low potential and the case where the first potential supply terminal 400 has a low potential and the second potential supply terminal 401 has a high potential.

In the voltage divider 405, the diode group 404 includes a plurality of diodes each having an anode and a cathode. The diodes are electrically connected in series in the same direction.

In addition, the diode group 404 includes diodes of N pieces of stages, which are formed using N pieces (N is a natural number) of diodes each having an anode and a cathode. An anode of a diode in a first stage is electrically connected to the first potential supply terminal through the first resistor. An anode of a diode in a $K^{th}$ stage (K is a natural number of any one of 2 to N−1) is electrically connected to a cathode of a diode in a K−$1^{th}$ stage. An anode of a diode in an $N^{th}$ stage is electrically connected to a cathode of a diode in an N−$1^{th}$ stage. A cathode of the diode in the $N^{th}$ stage is electrically connected to the second potential supply terminal.

Note that in the diode group 404, the anode of the diode in the first stage (the anode of the diode in the first stage in FIG. 9) is also referred to as a first terminal of the diode group 404, and an output terminal of the diode in the $N^{th}$ stage (an output terminal of the diode in the fifth stage in FIG. 9) is also referred to as a second terminal of the diode group 404.

In addition, although a structure where five diodes are electrically connected in series as the diode group 404 is illustrated in FIG. 9, the structure of the diode group 404 is not limited to this. The number of diodes can be set as appropriate in accordance with the level of a necessary divided potential.

In the bypass circuit 409, a first terminal of the transistor 407 is electrically connected to one cathode of diodes in 1 to $K^{th}$ stages in the diode group 404 of the voltage divider 405. One of a second terminal and a third terminal of the transistor 407 is electrically connected to the first potential supply terminal 400 through the resistor 406. The other of the second terminal and the third terminal of the transistor 407 is electrically connected to the second potential supply terminal 401.

Next, the operations of the semiconductor device illustrated in FIG. 8 and FIG. 9 are described. Note that for example, the operations are described with the transistor 407 in the bypass circuit 409 as an N-channel transistor. In addition, a high potential is applied from the outside through the first potential supply terminal 400, and a low potential is applied from the outside through the second potential supply terminal 401 in a normal condition.

The operations of the semiconductor device illustrated in FIG. 8 and FIG. 9 are divided into an operation in the case where power supply voltage within the necessary range is applied from the outside (in a normal condition) and an operation in the case where power supply voltage that might damage an element is applied from the outside (in the case where overvoltage is applied).

First, the operation in the normal condition is described.

In the case where a potential within the necessary range is applied from the outside, a potential difference having a certain level is applied between the first potential supply terminal 400 and the second potential supply terminal 401. In the normal condition, voltage applied between the first potential supply terminal 400 and the second potential supply terminal 401 is referred to as first power supply voltage.

In the voltage divider 405, the first power supply voltage is divided, and a potential of a connection point (also referred to as a node) between the diode group 404 and the first terminal of the transistor 407 in the bypass circuit 409 corresponds to the divided first power supply voltage. In this case, the potential of the node between the diode group 404 and the first terminal of the transistor 407 is referred to as a divided potential. Note that the level of the divided potential can be set as appropriate in accordance with the resistance value of the resistor 403, the level of the threshold voltage of each diode in the diode group 404 and the like.

In the bypass circuit 409, the transistor 407 is turned off in accordance with the divided potential. When the transistor 407 is off, the first power supply voltage is applied to the photoelectric conversion circuit 411. The absolute value of the threshold voltage of the transistor 407 is preferably set to be larger than the absolute value of the divided potential in the normal condition. For example, the threshold voltage is preferably set to a level at which the transistor 407 is surely turned off in the normal condition.

In the photoelectric conversion circuit 411, a current-voltage conversion operation is performed with the first power supply voltage as power supply voltage. Since the current-voltage conversion operation is the same as that of the photoelectric conversion circuit 318 illustrated in Embodiment 3, description thereof is omitted. The above is the operation in the normal condition.

Next, the operation in the case where overvoltage is applied is described.

In the case where overvoltage is applied from the outside, a high potential difference is applied between the first potential supply terminal 400 and the second potential supply terminal 401. In the case where overvoltage is applied, voltage applied between the first potential supply terminal 400 and the second potential supply terminal 401 is referred to as second power supply voltage.

In the voltage divider 405, the second power supply voltage is divided, and a potential of the connection point (also referred to as the node) between the diode group 404 and the first terminal of the transistor 407 in the bypass circuit 409 corresponds to the divided second power supply voltage. In this case, the potential of the node between the diode group 404 and the first terminal of the transistor 407 is referred to as a divided potential. Note that the level of the divided potential can be set as appropriate by setting the resistance value of the resistor 403, the level of the threshold voltage of each diode in the diode group 404, and the like.

In the bypass circuit 409, the transistor 407 is turned on in accordance with the divided potential applied to the first terminal of the transistor 407. When the transistor 407 is on, the first potential supply terminal 400 and the second potential supply terminal 401 are brought into conduction through the resistor 406, the transistor 407, and the resistor 408. When the first potential supply terminal 400 and the second potential supply terminal 401 are conducted, the bypass circuit 409 is a leak path and part of current corresponding to the second power supply voltage leaks. In this case, the absolute value of the threshold voltage of the transistor 407 is preferably set to be smaller than the absolute value of the divided potential in the case where overvoltage that might damage the functional circuit, is applied. For example, the threshold voltage is preferably set to a level at which the transistor 407 is turned on in the case where overvoltage that might damage the functional circuit, is applied.

In the photoelectric conversion circuit 411, a current-voltage conversion operation is performed using the applied power supply voltage. Note that since the current-voltage conversion operation is the same as that of the photoelectric conversion circuit 318 illustrated in Embodiment 3, description thereof is omitted. The above is the operation in the case where overvoltage is applied.

As described above, in the semiconductor device of this embodiment, the element in the photoelectric conversion circuit can be protected without hampering an actual operation in the case where overvoltage that might damage the element in the photoelectric conversion circuit is applied.

Specifically, as for the semiconductor device of this embodiment, in the photoelectric conversion circuit, even if overvoltage due to static electricity is applied to the transistor in the amplifier circuit, which has relatively lower withstand voltage than a photoelectric conversion element, damage to the transistor in the amplifier circuit can be suppressed.

In addition, in the semiconductor device of this embodiment, since current flows to the transistor through the resistors in the bypass circuit, deterioration of the transistor can be suppressed.

Further, since the semiconductor device of this embodiment can have a simpler structure than the semiconductor device illustrated in Embodiment 3, a circuit area can be reduced.

Note that this embodiment can be combined with any of other embodiments as appropriate.

Embodiment 5

In this embodiment, a method for manufacturing a semiconductor device including the photoelectric conversion circuit illustrated in Embodiment 3, Embodiment 4, or the like is described. Note that in this embodiment, for example, the case of forming a thin film transistor as a transistor is described.

An example of a method for manufacturing a semiconductor device of this embodiment is described with reference to FIGS. 10A to 10D and FIGS. 11A to 11C. FIGS. 10A to 10D and FIGS. 11A to 11C are cross-sectional schematic views illustrating an example of a method for manufacturing the semiconductor device of this embodiment. Note that FIGS. 10A to 10D and FIGS. 11A to 11C schematically illustrate cross sections of the semiconductor device for convenience and uses sizes which are partly or entirely different from actual sizes.

Note that as the example of the method for manufacturing the semiconductor device illustrated in FIGS. 10A to 10D and FIGS. 11A to 11C, an example of forming a photoelectric conversion element, a transistor, and a resistor over a substrate is described, for example. By forming a thin film transistor as the transistor formed over the substrate, the photoelectric conversion element and the transistor can be formed over the substrate in the sequential steps. Thus, there is an advantage that the semiconductor device including the photoelectric conversion circuit can be easily produced in large quantities. Further, by providing a gate electrode and a drain electrode of the transistor so as to be in contact with each other, the transistor can also be used as a diode.

Figure 10A:
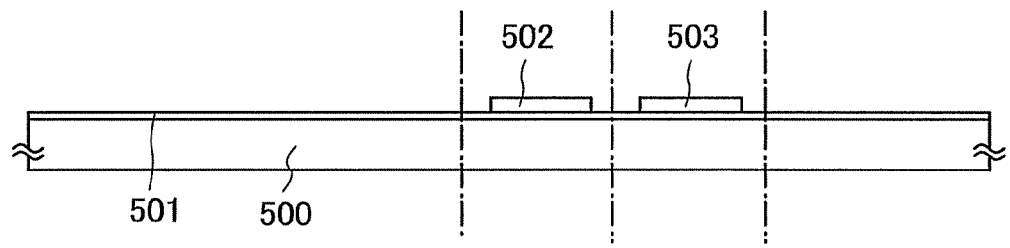
FIGS. 10A to 10D are cross-sectional schematic views illustrating an example of a method for manufacturing a semiconductor device of Embodiment 5.

First, as illustrated in FIG. 10A, a base insulating film 501 is formed over a substrate 500, and an island-shaped first semiconductor layer 502 and an island-shaped second semiconductor layer 503 are formed over part of the base insulating film 501.

A glass substrate or the like can be used as the substrate 500, for example. In addition, the base insulating film 501 can be formed using a single-layer structure or a layered structure of any of a silicon oxide film, a silicon nitride film, and a silicon oxide film containing nitrogen, for example. Further, the above described films can be formed by plasma-enhanced CVD or the like, for example. The silicon oxide film containing nitrogen and the silicon nitride film each function as a blocking layer which prevents impurity diffusion of an alkaline metal or the like from the glass substrate. In this embodiment, for example, a 100-nm-thick silicon oxide film containing nitrogen is formed as the base insulating film 501. Furthermore, for example, a non-single-crystal semiconductor film typified by amorphous silicon, polycrystalline silicon, microcrystalline (also referred to as microcrystal, nanocrystal, or semi-amorphous) silicon, or the like can be used for the first semiconductor layer 502 and the second semiconductor layer 503.

Alternatively, for example, a semiconductor film having a crystalline structure (a crystalline semiconductor film), which is formed by crystallizing an amorphous semiconductor film by a known technique (e.g., a solid-phase epitaxy method, a laser crystallization method, or a crystallization method using catalytic metal), e.g., a polycrystalline silicon film can be used for the first semiconductor layer 502 and the second semiconductor layer 503. Here, a polycrystalline silicon film is obtained by a crystallization method using a catalytic element. A nickel acetate solution containing 10 ppm by weight of nickel is added by a spinner. Note that a nickel element may be dispersed over the entire surface by sputtering instead of adding the solution. Subsequently, heat treatment for crystallization is performed to form a semiconductor film having a crystalline structure (here a polycrystalline silicon film). An example of forming the first semiconductor layer 502 and the second semiconductor layer 503 is described below.

In this embodiment, for example, first, a 54-nm-thick amorphous silicon film containing hydrogen is formed without being exposed to the atmosphere. Then, a polycrystalline silicon film is obtained by performing heat treatment for crystallization (at 550° C. for four hours) after heat treatment (at 500° C. for one hour) is performed.

Next, an oxide film over a surface of the polycrystalline silicon film is removed with dilute hydrofluoric acid or the like. After that, irradiation with laser light (XeCl laser having a wavelength of 308 nm) for increasing the degree of crystallinity and repairing defects left in crystal grains is performed in the atmosphere or an oxygen atmosphere.

As the laser lights excimer laser light having a wavelength less than or equal to 400 nm, or a second harmonic or a third harmonic of a YAG laser is used. Here, pulsed laser light having a repetition rate of approximately 10 to 1000 Hz is used; the pulsed laser light is condensed to greater than or equal to 100 mJ/cm$^2$ and less than or equal to 500 mJ/cm$^2$ by an optical system; and irradiation is performed with an overlap rate higher than or equal to 90% and lower than or equal to 95% to scan the surface of the silicon film. In this embodiment, irradiation with laser light having a repetition rate of 30 Hz and an energy density of 470 mJ/cm$^2$ is performed in the atmosphere.

Note that since laser light irradiation is performed in the atmosphere or in an oxygen atmosphere, an oxide film is formed over the surface by the laser light irradiation. Although an example of using the pulsed laser is illustrated in this embodiment, a continuous wave laser may be used. In order to obtain a crystal with a large grain size at the time of crystallization of a semiconductor film, it is preferable to use a solid laser capable of continuous oscillation and any of second to fourth harmonics of a fundamental wave. Typically, a second harmonic (532 nm) or a third harmonic (355 nm) of an Nd:YVO$_4$ laser (a fundamental wave of 1064 nm) is used.

In the case of using a continuous wave laser, laser light which is emitted from a continuous wave YVO$_4$ laser having an output of 10 W is converted into a harmonic by a non-linear optical element. In addition, there is a method by which a YVO$_4$ crystal and a non-linear optical element are put in a resonator and a high harmonic is emitted. Then, laser light is preferably shaped into a rectangular shape or an elliptic shape on an irradiated surface by an optical system and is emitted to an object to be processed. In this case, an energy density of approximately 0.01 to 100 MW/cm$^2$ (preferably 0.1 to 10

MW/cm²) is necessary. Then, the semiconductor film may be moved at a rate of approximately 10 to 2000 cm/s relatively to the laser light so as to be irradiated.

Next, in addition to the oxide film formed by the above laser light irradiation, a barrier layer formed using an oxide film having a thickness greater than or equal to 1 nm and less than or equal to 5 nm in total is formed by treatment of the surface with ozone water for 120 seconds. The barrier layer is formed in order to remove the catalytic element which is added for crystallization, e.g., nickel (Ni) from the film. Although the barrier layer is formed using ozone water here, the barrier layer may be formed by an oxide film having a thickness of approximately 1 to 10 nm by a method of oxidizing a surface of the semiconductor film having a crystalline structure by UV-ray irradiation in an oxygen atmosphere, a method of oxidizing the surface of the semiconductor film having a crystalline structure by oxygen plasma treatment, by depositing using plasma-enhanced CVD, sputtering, an evaporation method, or the like. Alternatively, the oxide film formed by the laser light irradiation may be removed before forming the barrier layer.

Next, an amorphous silicon film containing an argon element, which serves as a gettering site, is formed to a thickness greater than or equal to 10 nm and less than or equal to 400 nm, here a thickness of 100 nm, over the barrier layer by sputtering. Here, the amorphous silicon film containing an argon element is formed under an atmosphere containing argon by using a silicon target. In the case where the amorphous silicon film containing an argon element is formed by plasma-enhanced CVD, deposition conditions are as follows: a monosilane/argon ($SiH_4/Ar$) flow ratio of 1:99, a deposition pressure of 6.665 Pa, an RF power density of 0.087 W/cm², and a deposition temperature of 350° C.

After that, the substrate is placed in a furnace heated at 650° C., and heat treatment is performed for three minutes to remove the catalytic element (gettering). Thus, the catalytic element concentration in the semiconductor film having a crystalline structure is reduced. A lamp annealing apparatus may be used instead of the furnace.

Next, after the amorphous silicon film containing an argon element, which is a gettering site, is selectively removed using the barrier layer as an etching stopper, the barrier layer is selectively removed with dilute hydrofluoric acid. Note that since nickel has a tendency to move to a region having high oxygen concentration at the time of gettering, the barrier layer formed using an oxide film is preferably removed after the gettering.

In the case where crystallization of the semiconductor film is performed without using a catalytic element, the above steps such as forming the barrier layer, forming the gettering site, heat treatment for gettering, removing the gettering site, and removing the barrier layer are not necessary.

A method for manufacturing the first semiconductor layer 502 and the second semiconductor layer 503 illustrated in this embodiment is not limited to the above manufacturing method. Another manufacturing method can be used. For example, the first semiconductor layer 502 and the second semiconductor layer 503 may be formed using an SOI (silicon on insulator) substrate. It is acceptable as long as a known SOI substrate is used as the SOI substrate, and a manufacturing method and a structure thereof are not particularly limited to certain types. Typical examples of the SOI substrate are a SIMOX substrate and a bonded substrate. In addition, examples of the bonded substrate are ELTRAN (registered trademark), UNIBOND (registered trademark), Smart Cut (registered trademark), and the like.

As for a SIMOX substrate, an oxygen ion is introduced into a single crystal silicon substrate and heat treatment is performed at higher than or equal to 1300° C. to form a buried oxide film (BOX) layer, so that a thin film silicon layer is formed over a surface and an SOI structure can be obtained. The thin film silicon layer is insulated from the single crystal silicon substrate with the buried oxide film layer. Further, a technique referred to as ITOX (internal thermal oxidation) in which further thermal oxidation is performed can be used after forming the buried oxide film layer.

As for a bonded substrate, two single crystal silicon substrates (a first single crystal silicon substrate and a second single crystal silicon substrate) are bonded to each other with an oxide film layer interposed therebetween and one of the single crystal silicon substrates is thinned from a surface on a side which is opposite to the bonded side, so that an SOI substrate in which a thin film silicon layer is formed on a surface is formed. The oxide film layer can be formed by thermally oxidizing one of the substrates (here the first single crystal silicon substrate). In addition, the two single crystal silicon substrates can be directly bonded to each other without using an adhesive agent.

Note that as the bonded substrate, an SOI substrate may be formed by bonding a substrate having an insulating surface, such as a glass substrate, and a single crystal substrate to each other, without limiting to bonding two single crystal substrates.

Furthermore, in this embodiment, after a thin oxide film is formed over the surface of the obtained semiconductor film having a crystalline structure (e.g., a crystalline silicon film) by using ozone water, a mask formed using a resist is formed using a first photomask to etch the semiconductor film to have a desired shape, so that the first semiconductor layer 502 and the second semiconductor layer 503 which are separated from each other in island shapes are formed. After the first semiconductor layer 502 and the second semiconductor layer 503 are formed, the mask formed using the resist is removed.

Moreover, in this embodiment, a slight amount of an impurity element (e.g., boron or phosphorus) is added in order to control the threshold voltage of a TFT, if necessary. Here, an ion doping method by which diborane ($B_2H_6$) is not mass-separated but excited by plasma is used.

Moreover, in this embodiment, the oxide film is removed with an etchant containing hydrofluoric acid, and at the same time, surfaces of the first semiconductor layer 502 and the second semiconductor layer 503 are cleaned. After that, an insulating film containing silicon as its main component, which serves as the gate insulating film 504, is formed. Here, a silicon oxide film containing nitrogen (a composition ratio of Si=32%, O=59%, N=7%, and H=2%) is formed to a thickness of 115 nm by plasma-enhanced CVD.

Figure 10B:
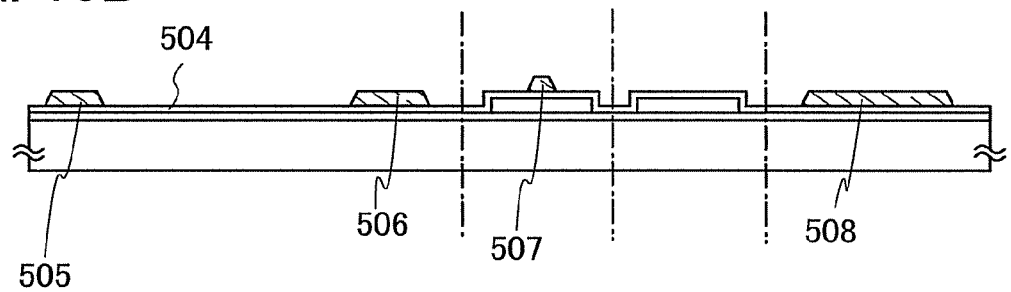

Next, as illustrated in FIG. 10B, the gate insulating film 504 is formed over the base insulating film 501 with the first semiconductor layer 502 and the second semiconductor layer 503 interposed therebetween; electrodes 505, 506, and 508 are formed over the gate insulating film 504; and a gate electrode 507 is formed over part of the first semiconductor layer 502 with the gate insulating film 504 interposed therebetween. As the gate insulating film 504, an insulating nitride film, an insulating oxide film, an insulating oxide film containing nitrogen, or the like can be used, for example. In addition, for the electrodes 505, 506, and 508, and the gate electrode 507, a single-layer film formed using an element selected from titanium, tungsten, tantalum, molybdenum, neodymium, cobalt, zirconium, zinc, ruthenium, rhodium, palladium, osmium, iridium, platinum, aluminum, gold, silver, or copper, or an alloy material or a compound material containing the above element as its main component; or a single-layer film formed using nitride of the above element, e.g., titanium nitride, tungsten nitride, tantalum nitride, or molybdenum nitride can be used, for example.

Figure 10C:
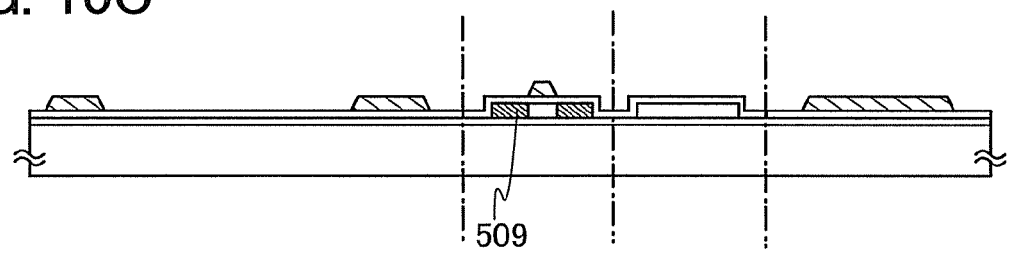

Next, as illustrated in FIG. 10C, an impurity which imparts one conductivity type is introduced into the first semiconductor layer 502 to form impurity regions 509 which serve as a source region and a drain region in the first semiconductor layer 502. Although an n-type impurity such as phosphorus or arsenic is introduced in this embodiment, for example, the kind of the impurity is not limited to this. A p-type impurity can be introduced into the first semiconductor layer 502.

Figure 10D:
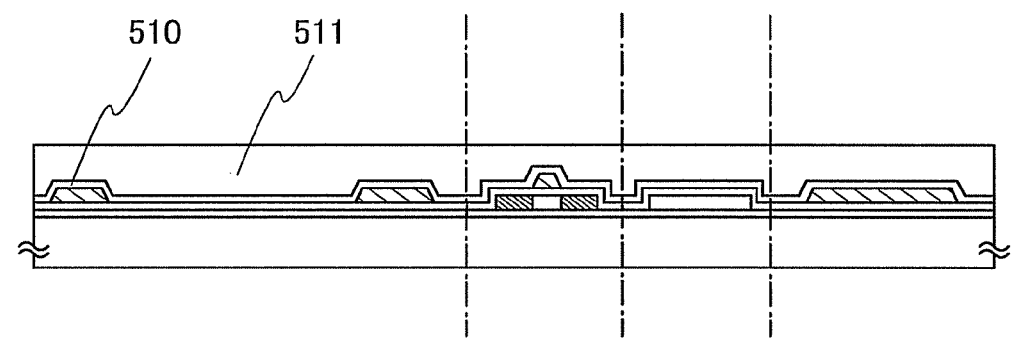

Next, as illustrated in FIG. 10D, a first interlayer insulating film 510 is formed over the gate insulating film 504 with the electrodes 505, 506, and 508 and the gate electrode 507 interposed therebetween. The first interlayer insulating film 510 can be formed using a single-layer structure or a layered structure of any of an insulating oxide film, an insulating nitride film, an insulating nitride film containing oxygen, an insulating nitride film containing hydrogen and oxygen, or the like by CVD or the like, for example. In this embodiment, for example, after a first interlayer insulating film 510 containing a silicon oxide film is formed to a thickness of 50 nm by CVD, a step of activating the impurity element added to each island-shaped semiconductor layer is performed. This activation step is performed by rapid thermal annealing (RTA) using a lamp light source, an irradiation method with a YAG laser or an excimer laser from the back side, heat treatment using a furnace, or a method in which any of the above methods are combined.

In addition, a second interlayer insulating film 511 is formed over the first interlayer insulating film 510. An insulating material can be used for the second interlayer insulating film 511, for example. Alternatively, an insulating film obtained by CVD can be used for the second interlayer insulating film 511. In this embodiment, in order to improve adherence strength, a silicon oxide film containing nitrogen is formed to a thickness of 900 nm as the second interlayer insulating film 511.

Further, in this embodiment, heat treatment (heat treatment at higher than or equal to 300° C. and lower than or equal to 550° C. for 1 to 12 hours, e.g., at 410° C. for one hour in a nitrogen atmosphere) is performed to hydrogenate the first semiconductor layer 502 and the second semiconductor layer 503. This step is performed in order to terminate a dangling bond of the semiconductor layers by hydrogen contained in the first interlayer insulating film 510. The semiconductor layers can be hydrogenated regardless of whether the gate insulating film 504 is formed.

Alternatively, as the second interlayer insulating film 511, an insulating film using siloxane or a layered structure thereof can be used. Siloxane has a skeleton structure by the bond of silicon (Si) and oxygen (O). An organic group (e.g., an alkyl group or an aromatic hydrocarbon group) or a fluoro group may be used as a substituent. A fluoro group may be contained in the organic group. In the case where an insulating film using siloxane or a layered structure thereof is used as the second interlayer insulating film 511, after forming the first interlayer insulating film 510, heat treatment for hydrogenating the island-shaped semiconductor films is performed. Then, the second interlayer insulating film 511 can be formed.

Next, a mask formed using a resist is formed using a third photomask, and the first interlayer insulating film 510, the second interlayer insulating film 511, and the gate insulating film 504 are selectively etched to form contact holes. Then, the mask formed using the resist is removed.

Note that the second interlayer insulating film 511 may be formed as necessary. In the case where the second interlayer insulating film 511 is not formed, the first interlayer insulating film 510 and the gate insulating film 504 are selectively etched after forming the first interlayer insulating film 510 to form contact holes.

Figure 11A:
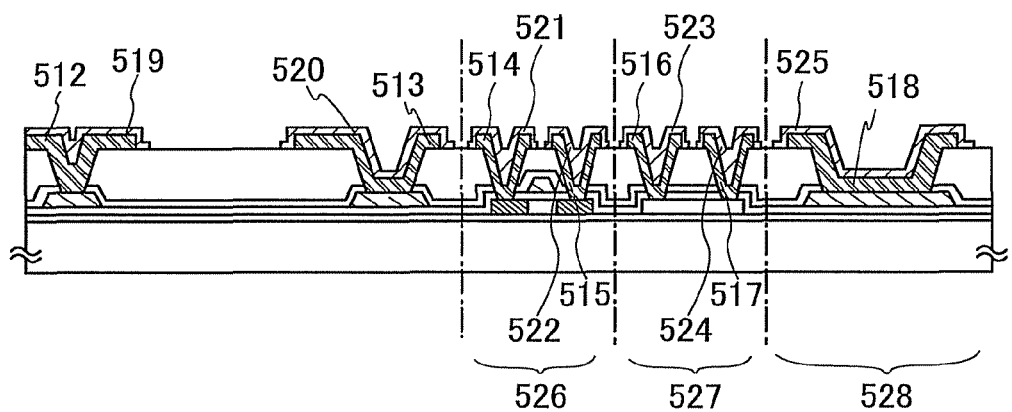
FIGS. 11A to 11C are cross-sectional schematic views illustrating the example of the method for manufacturing the semiconductor device of Embodiment 5.

Next, as illustrated in FIG. 11A, after a metal stacked film is formed by sputtering, a mask formed using a resist is formed using a fourth photomask, and the metal film is selectively etched to form electrodes 512 to 518. Then, the mask formed using the resist is removed.

The electrode 512 is electrically connected to the electrode 505 through the contact hole. The electrode 513 is electrically connected to the electrode 506 through the contact hole. The electrodes 514 and 515 are electrically connected to the impurity regions 509 in the first semiconductor layer 502 through the contact holes. The electrode 518 is electrically connected to the electrode 508 through the contact hole. Note that in a method for manufacturing a semiconductor device illustrated in FIGS. 11A to 11C, for example, the electrodes 512 to 518 are formed by stacking three layers: a 100-nm-thick Ti film, a 350-nm-thick Al film containing Si, and a 100-nm-thick Ti film.

In addition, for the electrodes 512 to 518, titanium is preferably used in terms of heat resistance, conductivity, or the like. Alternatively, instead of titanium, a single-layer film formed using an element selected from tungsten, tantalum, molybdenum, neodymium, cobalt, zirconium, zinc, ruthenium, rhodium, palladium, osmium, iridium, or platinum, or an alloy material or a compound material containing the above element as its main component; or a single-layer film formed using nitride of the above element, e.g., titanium nitride, tungsten nitride, tantalum nitride, or molybdenum nitride can be used. By forming the electrodes 512 to 518 by using a single-layer film, the number of depositions can be reduced in manufacturing steps.

Next, after forming a conductive metal film (e.g., titanium or molybdenum) which does not easily become an alloy by reacting with a photoelectric conversion element which is formed later, a mask formed using a resist is formed using a fifth photomask, and the conductive metal film is selectively etched to form protective electrodes 519 to 525 over the electrodes 512 to 518, respectively. In the method for manufacturing the semiconductor device illustrated in FIGS. 11A to 11C, a 200-nm-thick Ti film obtained by sputtering is used for the protective electrodes 519 to 525. Therefore, the conductive metal film also covers a side face where the second-layer Al film is exposed in these electrodes, so that the conductive metal film can also prevent diffusion of an aluminum atom to the photoelectric conversion element.

Note that in the case where the electrodes 512 to 518 are formed using a single-layer conductive film, the protective electrodes 519 to 525 are not necessarily formed.

Thus, a transistor formed using a polycrystalline silicon film 526, a resistor 527, and a terminal portion 528 can be formed.

Figure 11B:
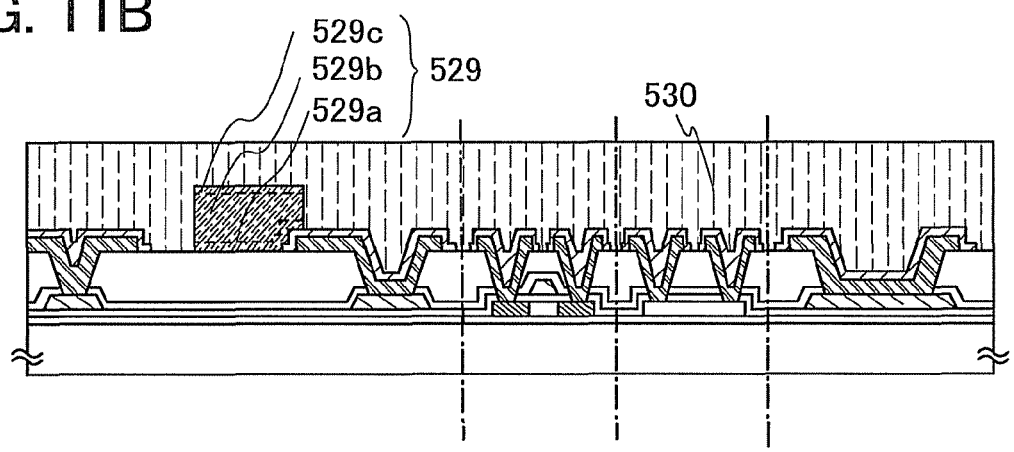

Next, as illustrated in FIG. 11B, a photoelectric conversion element 529 including a p-type semiconductor layer 529a, an i-type (intrinsic) semiconductor layer 529b, and an n-type semiconductor layer 529c is formed over the second interlayer insulating film 511.

The p-type semiconductor layer 529a may be formed using a semi-amorphous silicon film containing an impurity element belonging to Group 13 of the periodic table, e.g., boron (B) by plasma-enhanced CVD.

Further, the protective electrode 520 is in contact with the bottom layer of the photoelectric conversion element 529, i.e., the p-type semiconductor layer 529a in this embodiment.

After the p-type semiconductor layer 529a is formed, the i-type semiconductor layer 529b and the n-type semiconductor layer 529c are sequentially formed. Thus, the photoelectric conversion element 529 including the p-type semiconductor layer 529a, the i-type semiconductor layer 529b, and the n-type semiconductor layer 529c is formed.

As the i-type semiconductor layer 529b, for example, a microcrystalline silicon film may be formed by plasma-enhanced CVD. In addition, as the n-type semiconductor layer 529c, a microcrystalline silicon film containing an impurity element belonging to Group 15 of the periodic table, e.g., phosphorus (P) may be formed. Alternatively, after a microcrystalline silicon film is formed, an impurity element belonging to Group 15 of the periodic table may be introduced.

Alternatively, an amorphous semiconductor film as well as a semi-amorphous semiconductor film may be used for the p-type semiconductor layer 529a, the i-type semiconductor layer 529b, or the n-type semiconductor layer 529c.

Next, a sealing layer 530 formed using an insulating material (e.g., an inorganic insulating film containing silicon) is formed to a thickness greater than or equal to 1 μm and less than or equal to 30 μm over the entire surface. Here, as the insulating material film, a 1-μm-thick silicon oxide film containing nitrogen is formed by CVD. By using an insulating film formed by CVD, adhesiveness is improved.

Figure 11C:
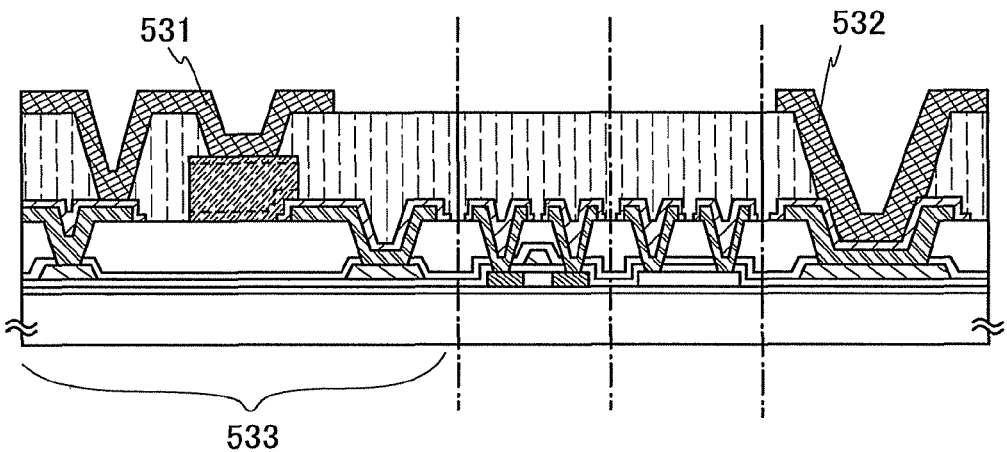

Next, as illustrated in FIG. 11C, after the sealing layer 530 is etched to provide opening portions, electrodes 531 and 532 are formed by sputtering. For the electrodes 531 and 532, a single-layer film formed using an element selected from titanium, tungsten, tantalum, molybdenum, neodymium, cobalt, zirconium, zinc, ruthenium, rhodium, palladium, osmium, iridium, platinum, or gold, or an alloy material or a compound material containing the above element as its main component; or a single-layer film formed using nitride of the above element, e.g., titanium nitride, tungsten nitride, tantalum nitride, or molybdenum nitride can be used. The thus obtained electrodes 531 and 532 have an adherence strength higher than 5 N, which is sufficient adherence strength as electrodes.

Thus, a photoelectric conversion portion 533 is formed.

As described above, the semiconductor device of this embodiment can be manufactured. In addition, since a diode, a resistor, a transistor, and a photoelectric conversion portion can be formed over the same substrate by using the method for manufacturing the semiconductor device of this embodiment, mass production is facilitated.

Note that the semiconductor device obtained through the above steps can be produced in large quantities by cutting the substrate into separate sections and cutting out a plurality of semiconductor devices. A large quantity of photoelectric conversion devices (e.g., 2 mm×1.5 mm each) can be manufactured from one large-area substrate (e.g., 600 cm×720 cm).

Note that this embodiment can be combined with any of other embodiments as appropriate.

Embodiment 6

In this embodiment, an electronic device into which a semiconductor device which is an embodiment of the present invention is incorporated is described.

As examples of electronic devices to which the semiconductor device which is an embodiment of the present invention can be applied, there are computers, displays, mobile phones, television receivers, and the like. Specific examples of such electronic devices are described with reference to FIG. 12, FIGS. 13A and 13B, FIGS. 14A and 14B, FIG. 15, and FIGS. 16A and 16B. FIG. 12, FIGS. 13A and 13B, FIGS. 14A and 14B, FIG. 15, and FIGS. 16A and 16B illustrate structural examples of electronic devices of this embodiment.

Figure 12:
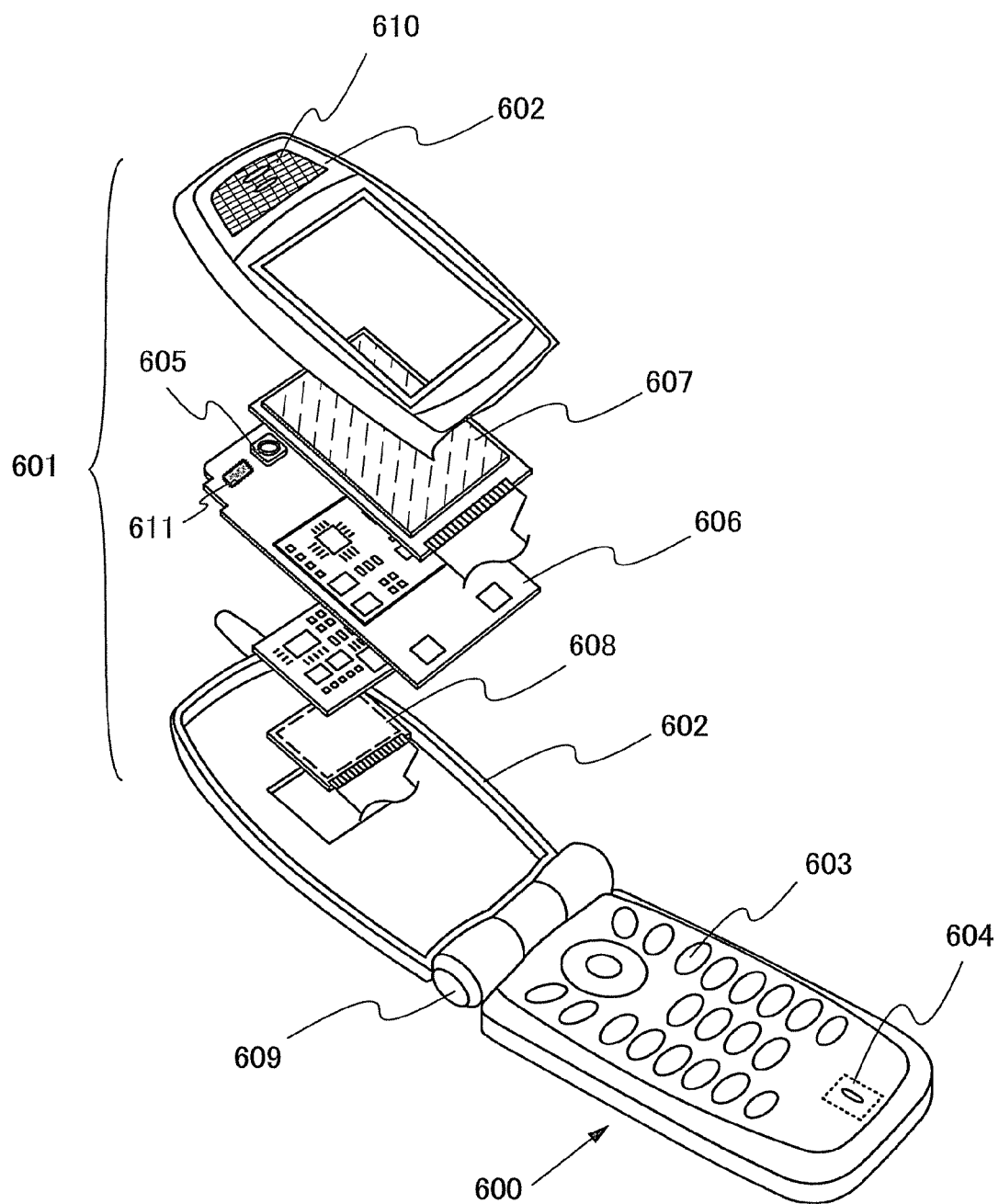
FIG. 12 is a diagram illustrating an electronic device including a semiconductor device of Embodiment 6.

The electronic device illustrated in FIG. 12 is a mobile phone, which includes a main body (A) 600, a main body (B) 601, a housing 602, operation keys 603, an audio input portion 604, an audio output portion 605, a circuit substrate 606, a display panel (A) 607, a display panel (B) 608, a hinge 609, a light-transmitting material portion 610, and a photoelectric conversion device 611. The semiconductor device which is an embodiment of the present invention can be applied to the photoelectric conversion device 611.

The photoelectric conversion device 611 detects light which transmits through the light-transmitting material portion 610, controls the luminance of the display panel (A) 607 and the display panel (B) 608 in accordance with the illuminance of detected external light, and controls the illumination of the operation keys 603 in accordance with illuminance obtained by the photoelectric conversion device 611. Thus, current consumption of the mobile phone can be reduced.

Figure 13A:
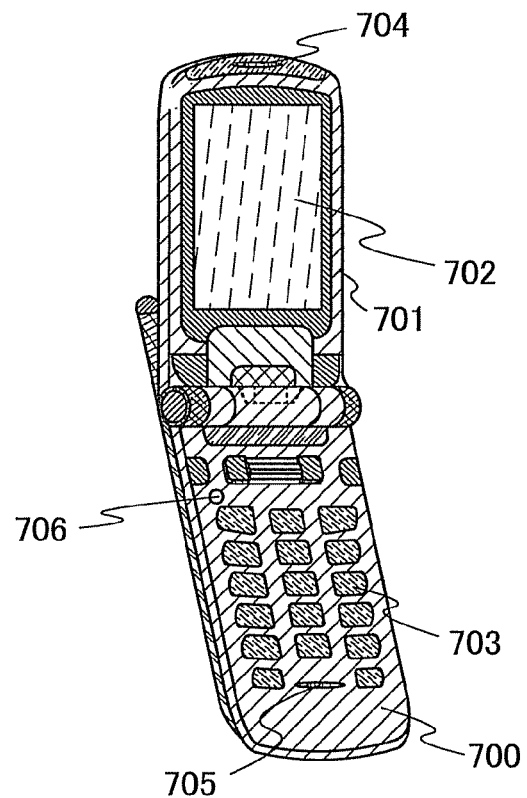
FIGS. 13A and 13B are diagrams each illustrating an electronic device including the semiconductor device of Embodiment 6.
Figure 13B:
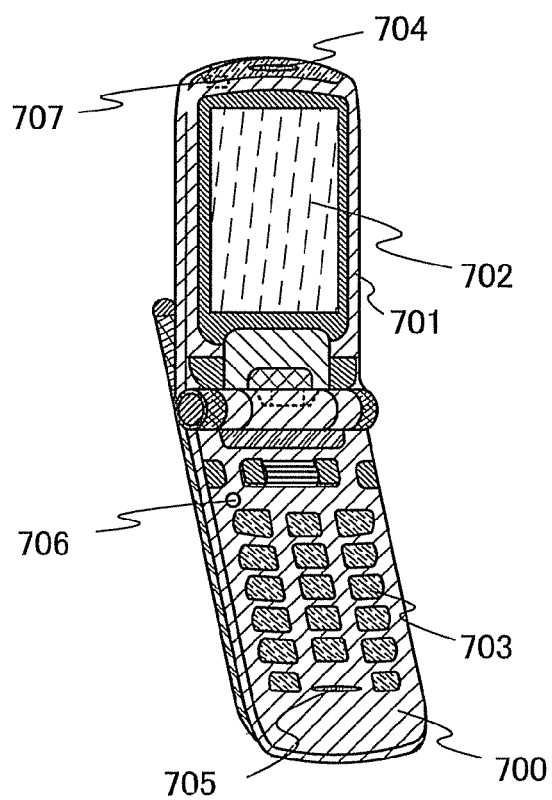

Next, FIGS. 13A and 13B illustrate other examples of a mobile phone. FIGS. 13A and 13B illustrate a main body 700, a housing 701, a display panel 702, operation keys 703, an audio output portion 704, an audio input portion 705, a photoelectric conversion device 706, and a photoelectric conversion device 707.

In the mobile phone illustrated in FIG. 13A, the luminance of the display panel 702 and the operation keys 703 can be controlled by detecting external light with the photoelectric conversion device 706 provided in the main body 700.

In addition, in the mobile phone illustrated in FIG. 13B, the photoelectric conversion device 707 is provided inside the main body 700, in addition to the structure of FIG. 13A. With the photoelectric conversion device 707, the luminance of a backlight provided in the display panel 702 can be detected.

Figure 14A:
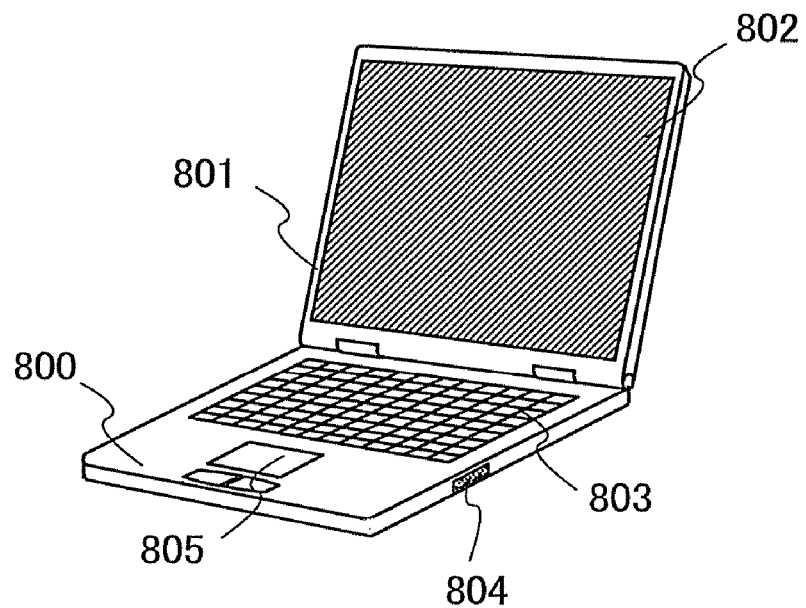
FIGS. 14A and 14B are diagrams each illustrating an electronic device including the semiconductor device of Embodiment 6.

The electronic device illustrated in FIG. 14A is a computer, which includes a main body 800, a housing 801, a display portion 802, a keyboard 803, an external connection port 804, a pointing device 805, and the like.

Figure 14B:
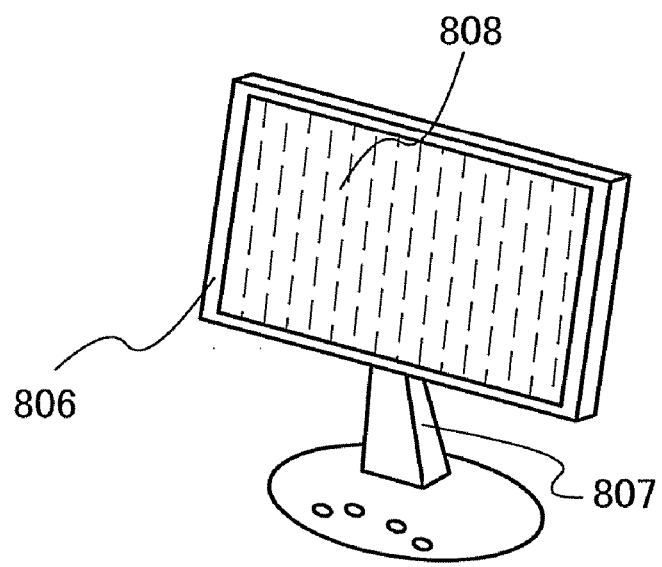

In addition, the electronic device illustrated in FIG. 14B is a display device, and a TV receiver or the like corresponds to this. The display device in FIG. 14B includes a housing 806, a support base 807, a display portion 808, and the like.

Figure 15:
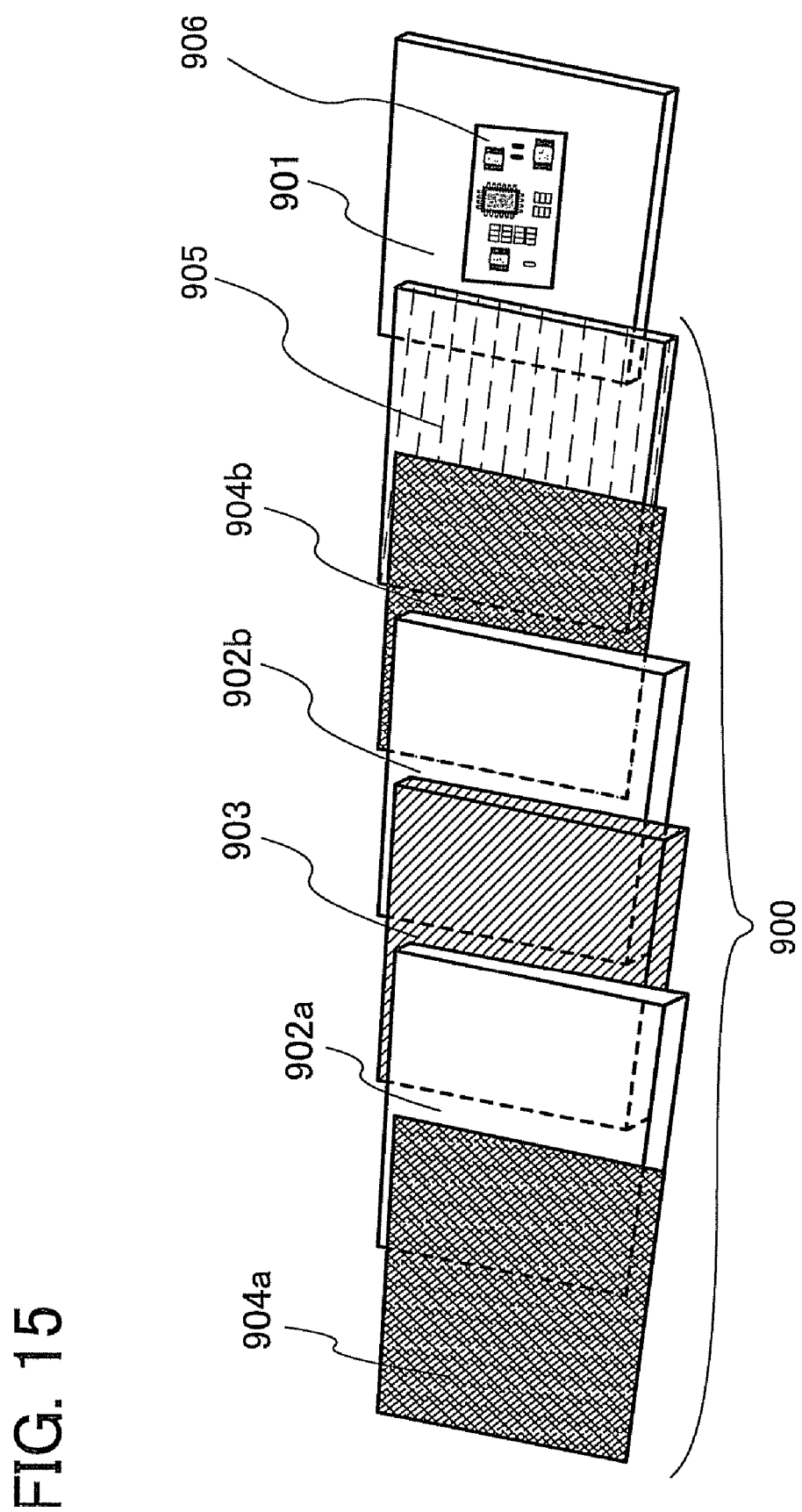
FIG. 15 is a diagram illustrating an electronic device including the semiconductor device of Embodiment 6.

FIG. 15 illustrates a detailed structure of the case where a liquid crystal panel is used for the display portion 802 provided in the computer illustrated in FIG. 14A and the display portion 808 of the display device illustrated in FIG. 14B.

The electronic device illustrated in FIG. 15 is a liquid crystal panel. A liquid crystal panel 900 is incorporated into a housing 901 and includes substrates 902a and 902b, a liquid crystal layer 903 interposed between the substrates 902a and 902b, polarizing filters 904a and 904b, a backlight 905, and the like. In addition, a photoelectric conversion device 906 is formed in the housing 901.

The photoelectric conversion device 906 which is a semiconductor device of an embodiment of the present invention detects the amount of light from the backlight 905, and the luminance of the liquid crystal panel 900 is adjusted when information thereof is fed back.

Figure 16A:
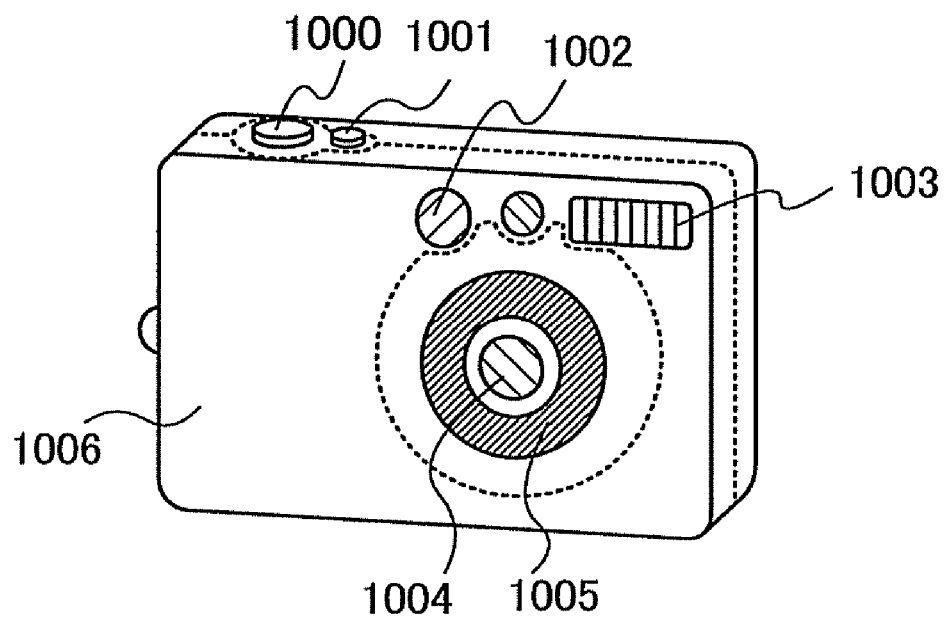
FIGS. 16A and 16B are diagrams illustrating an electronic device including the semiconductor device of Embodiment 6.
Figure 16B:
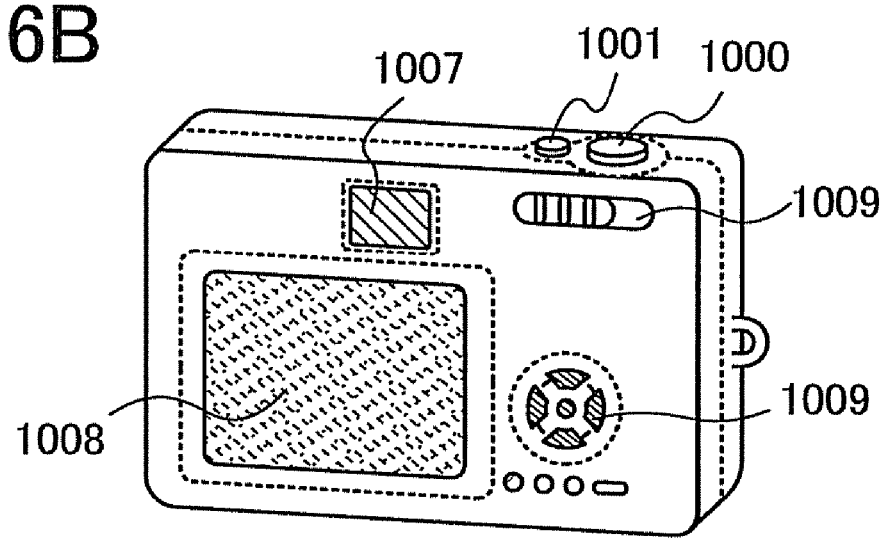

FIGS. 16A and 16B are diagrams illustrating an example in which the photoelectric conversion device which is a semiconductor device of an embodiment of the present invention is incorporated into a camera such as a digital camera. FIG. 16A is a front perspective view of the digital camera. FIG. 16B is a back perspective view of the digital camera. In FIG.

16A, the digital camera includes a release button 1000, a main switch 1001, a finder window 1002, a flash portion 1003, a lens 1004, a lens barrel 1005, and a housing 1006.

In addition, in FIG. 16B, a finder eyepiece window 1007, a monitor 1008, and operation buttons 1009 are provided.

When the release button 1000 is pressed down halfway, a focusing adjusting mechanism and an exposure adjusting mechanism are operated. When the release button 1000 is fully pressed down, a shutter is opened.

The main switch 1001 switches on/off of a power source of the digital camera by being pressed or rotated.

The finder window 1002 is provided above the lens 1004 on the front side of the digital camera and is a device for confirming an area which is photographed or a focus position from the finder eyepiece window 1007 illustrated in FIG. 16B.

The flash portion 1003 is provided in an upper portion of the front side of the digital camera. When the luminance of an object is low, auxiliary light is emitted from the flash portion 1003 at the same time as the release button 1000 is pressed down and the shutter is opened.

The lens 1004 is provided at the front face of the digital camera. The lens 1004 includes a focusing lens, a zoom lens, or the like, and forms a photographing optical system with the shutter and a diaphragm which are not illustrated. In addition, an image pickup device such as a charge coupled device (CCD) is provided behind the lens 1004.

The lens barrel 1005 moves the position of the lens to adjust the focus of the focusing lens, the zoom lens, or the like. At the time of photographing, the lens barrel 1005 is slid out to move the lens 1004 forward. Further, when the camera is carried, the lens 1004 is moved backward and made compact. Note that although a structure in which the lens barrel is slid out so that an object can be enlarged and photographed is used in this embodiment, the structure of the camera is not limited this. A digital camera may have a structure in which zoom shooting can be performed without sliding out the lens barrel by using the photographing optical system inside the housing 1006.

The finder eyepiece window 1007 is provided in an upper portion of the back side of the digital camera and is a window for looking through when confirming an area which is photographed or a focus position.

The operation buttons 1009 are buttons for various functions which are provided on the back side of the digital camera and include a setup button, a menu button, a display button, a functional button, a selection button, and the like.

When the photoelectric conversion device which is a semiconductor device of an embodiment of the present invention is incorporated into the camera illustrated in FIGS. 16A and 16B, the photoelectric conversion device can detect existence or nonexistence of light and light intensity, so that exposure adjustment or the like of the camera can be performed. The photoelectric conversion device of the present invention can function as an electrostatic protection circuit without hampering an actual operation. Therefore, a photoelectric conversion device which has high reliability on a malfunction and high optical sensitivity can be provided.

In addition, the photoelectric conversion device which is a semiconductor device of an embodiment of the present invention can be applied to other electronic devices such as a projection television and a navigation system. That is, the photoelectric conversion device which is a semiconductor device of an embodiment of the present invention can be used for any device where light is necessary to be detected.

Note that this embodiment can be combined with any of other embodiments as appropriate.

This application is based on Japanese Patent Application serial no. 2008-065980 filed with Japan Patent Office on Mar. 14, 2008, the entire contents of which are hereby incorporated by reference.

What is claimed is:

1. A semiconductor device comprising:
a first potential supply terminal to which a first potential is applied;
a second potential supply terminal to which a second potential is applied;
a voltage divider including a first resistor and a diode group including diodes of N pieces (N is a natural number) of stages each having an anode and a cathode for dividing voltage between the first potential supply terminal and the second potential supply terminal and generating a divided potential corresponding to the divided voltage;
a control circuit comprising a second resistor and a transistor including a first terminal serving as a control terminal, a second terminal, and a third terminal for generating a control potential in accordance with the divided voltage;
a bypass circuit including a third resistor and a switching element electrically connected in parallel to the third resistor; and
a functional circuit including a first input terminal and a second input terminal,
wherein an anode of a diode in a first stage is electrically connected to the first potential supply terminal through the first resistor, an anode of a diode in a Kth stage (K is a natural number of any one of 2 to N−1) is electrically connected to a cathode of a diode in a K−1th stage, an anode of a diode in an Nth stage is electrically connected to a cathode of a diode in an N−1th stage, and a cathode of the diode in the Nth stage is electrically connected to the second potential supply terminal,
wherein the first terminal of the transistor is electrically connected to one cathode of the diodes in 1 to Kth stages,
wherein on/off of the switching element is controlled in accordance with the control potential,
wherein the first input terminal is electrically connected to the first potential supply terminal through the switching element and the third resistor, and
wherein the second input terminal is electrically connected to the second potential supply terminal.

2. The semiconductor device according to claim 1,
wherein the functional circuit is a photoelectric conversion circuit,
wherein the photoelectric conversion circuit includes a photoelectric conversion element whose cathode is electrically connected to the first input terminal, an output resistor, an amplifier circuit, and an output terminal,
wherein the amplifier circuit includes a reference transistor including a first terminal serving as a control terminal, a second terminal, and a third terminal and an output transistor group including a first terminal serving as a control terminal, a second terminal, and a third terminal,
wherein the first terminal and one of the second terminal and the third terminal of the reference transistor are electrically connected to an anode of the photoelectric conversion element,
wherein the other of the second terminal and the third terminal of the reference transistor is electrically connected to the output terminal and is electrically connected to the second input terminal through the output resistor, wherein the first terminal of the output transistor group is electrically connected to the first terminal of the reference transistor, wherein one of the second terminal and the third terminal of the output transistor group is electrically connected to the first input terminal, and wherein the other of the second terminal and the third terminal of the output transistor group is electrically connected to the output terminal and is electrically connected to the second input terminal through the output resistor.

3. The semiconductor device according to claim 1 further comprising a diode including an anode and a cathode, wherein the anode is electrically connected to the second potential supply terminal, and wherein the cathode is electrically connected to the first potential supply terminal.

4. The semiconductor device according to claim 1, wherein the switching element included in the semiconductor device is a transistor.

5. The semiconductor device according to claim 1, wherein the switching element included in the semiconductor device is a thin film transistor.

6. The semiconductor device according to claim 1, wherein the switching element included in the semiconductor device is provided over a substrate having an insulating surface.

7. The semiconductor device according to claim 1, wherein the second resistor includes a first terminal and a second terminal, wherein the first terminal of the second resistor is electrically connected to the first potential supply terminal and the second terminal of the second resistor is electrically connected to the second terminal of the transistor, and wherein the third terminal of the transistor is electrically connected to the second potential supply terminal.

8. A semiconductor device comprising:

a first potential supply terminal to which a first potential is applied;

a second potential supply terminal to which a second potential is applied;

a voltage divider including a first resistor and a diode group including diodes of N pieces (N is a natural number) of stages each having an anode and a cathode;

a bypass circuit including a second resistor, a thin film transistor including a control terminal, and a third resistor electrically connected to the second resistor through the thin film transistor; and a functional circuit including a first input terminal and a second input terminal, wherein an anode of a diode in a first stage is electrically connected to the first potential supply terminal through the first resistor, an anode of a diode in a Kth stage (K is a natural number of any one of 2 to N−1) is electrically connected to a cathode of a diode in a K−1th stage, an anode of a diode in an Nth stage is electrically connected to a cathode of a diode in an N−1th stage, and a cathode of the diode in the Nth stage is electrically connected to the second potential supply terminal, wherein the control terminal of the thin film transistor is electrically connected to one cathode of the diodes in 1 to Kth stages, wherein the first input terminal is electrically connected to the first potential supply terminal, and wherein the second input terminal is electrically connected to the second potential supply terminal and is electrically connected to the first potential supply terminal through the second resistor, the thin film transistor, and the third resistor.

9. The semiconductor device according to claim 8, wherein the functional circuit is a photoelectric conversion circuit, wherein the photoelectric conversion circuit includes a photoelectric conversion element whose cathode is electrically connected to the first input terminal, an output resistor, an amplifier circuit, and an output terminal, wherein the amplifier circuit includes a reference transistor including a first terminal serving as a control terminal, a second terminal, and a third terminal and an output transistor group including a first terminal serving as a control terminal, a second terminal, and a third terminal, wherein the first terminal and one of the second terminal and the third terminal of the reference transistor are electrically connected to an anode of the photoelectric conversion element, wherein the other of the second terminal and the third terminal of the reference transistor is electrically connected to the output terminal and is electrically connected to the second input terminal through the output resistor, wherein the first terminal of the output transistor group is electrically connected to the first terminal of the reference transistor, wherein one of the second terminal and the third terminal of the output transistor group is electrically connected to the first input terminal, and wherein the other of the second terminal and the third terminal of the output transistor group is electrically connected to the output terminal and is electrically connected to the second input terminal through the output resistor.

10. The semiconductor device according to claim 8 further comprising a diode including an anode and a cathode, wherein the anode is electrically connected to the second potential supply terminal, and wherein the cathode is electrically connected to the first potential supply terminal.

11. The semiconductor device according to claim 8, wherein the thin film transistor included in the semiconductor device is provided over a substrate having an insulating surface.

12. The semiconductor device according to claim 8, wherein the first resistor includes a first terminal and a second terminal, wherein the first terminal of the first resistor is electrically connected to the first potential supply terminal.

13. A semiconductor device comprising:

a first potential supply terminal to which a first potential is applied;

a second potential supply terminal to which a second potential is applied;

a voltage divider;

a control circuit;

a bypass circuit; and a functional circuit including a first input terminal and a second input terminal, wherein the second input terminal is electrically connected to the second potential supply terminal, wherein the voltage divider includes a first resistor and a diode group including diodes of N pieces (N is a natural number) of stages each having an anode and a cathode, wherein an anode of a diode in a first stage is electrically connected to the first potential supply terminal through the first resistor, an anode of a diode in a Kth stage (K is a natural number of any one of 2 to N−1) is electrically connected to a cathode of a diode in a K−1th stage, an anode of a diode in an Nth stage is electrically connected to a cathode of a diode in an N−1th stage, and a cathode of the diode in the Nth stage is electrically connected to the second potential supply terminal, wherein the control circuit includes a second resistor and a first transistor including a first terminal serving as a control terminal, a second terminal, and a third terminal, wherein the first terminal of the first transistor is electrically connected to one cathode of the diodes in 1 to Kth stages, wherein one of the second terminal and the third terminal of the first transistor is electrically connected to the first potential supply terminal through the second resistor, wherein the other of the second terminal and the third terminal of the first transistor is electrically connected to the second potential supply terminal, wherein the bypass circuit includes a third resistor and a second transistor including a first terminal serving as a control terminal, a second terminal, and a third terminal, wherein the first terminal of the second transistor is electrically connected to the one of the second terminal and the third terminal of the first transistor, wherein one of the second terminal and the third terminal of the second transistor is electrically connected to the first potential supply terminal, and wherein the other of the second terminal and the third terminal of the second transistor is electrically connected to the first input terminal of the functional circuit and is electrically connected to the first potential supply terminal through the third resistor.

14. The semiconductor device according to claim 13 further comprising a second bypass circuit, wherein the control circuit further includes a fourth resistor and a third transistor including a first terminal serving as a control terminal, a second terminal, and a third terminal, wherein the first terminal of the third transistor is electrically connected to the one of the second terminal and the third terminal of the first transistor, wherein one of the second terminal and the third terminal of the third transistor is electrically connected to the first potential supply terminal through the fourth resistor, wherein the other of the second terminal and the third terminal of the third transistor is electrically connected to the second potential supply terminal, wherein the second bypass circuit includes a fifth resistor and a fourth transistor including a first terminal serving as a control terminal, a second terminal, and a third terminal, wherein the first terminal of the fourth transistor is electrically connected to the one of the second terminal and the third terminal of the third transistor, wherein one of the second terminal and the third terminal of the fourth transistor is electrically connected to the second potential supply terminal, and wherein the other of the second terminal and the third terminal of the fourth transistor is electrically connected to the second input terminal of the functional circuit and is electrically connected to the second potential supply terminal through the fifth resistor.

15. The semiconductor device according to claim 13, wherein the functional circuit is a photoelectric conversion circuit, wherein the photoelectric conversion circuit includes a photoelectric conversion element whose cathode is electrically connected to the first input terminal, an output resistor, an amplifier circuit, and an output terminal, wherein the amplifier circuit includes a reference transistor including a first terminal serving as a control terminal, a second terminal, and a third terminal and an output transistor group including a first terminal serving as a control terminal, a second terminal, and a third terminal, wherein the first terminal and one of the second terminal and the third terminal of the reference transistor are electrically connected to an anode of the photoelectric conversion element, wherein the other of the second terminal and the third terminal of the reference transistor is electrically connected to the output terminal and is electrically connected to the second input terminal through the output resistor, wherein the first terminal of the output transistor group is electrically connected to the first terminal of the reference transistor, wherein one of the second terminal and the third terminal of the output transistor group is electrically connected to the first input terminal, and wherein the other of the second terminal and the third terminal of the output transistor group is electrically connected to the output terminal and is electrically connected to the second input terminal through the output resistor.

16. The semiconductor device according to claim 13 further comprising a diode including an anode and a cathode, wherein the anode of the diode is electrically connected to the second potential supply terminal, and wherein the cathode of the diode is electrically connected to the first potential supply terminal.

17. The semiconductor device according to claim 13, wherein at least one of the first transistor and the second transistor is a thin film transistor.

18. The semiconductor device according to claim 13, wherein at least one of the first transistor and the second transistor is provided over a substrate having an insulating surface.

19. A semiconductor device comprising:
a first potential supply terminal to which a first potential is applied;
a second potential supply terminal to which a second potential is applied;
a voltage divider;
a bypass circuit; and
a functional circuit including a first input terminal and a second input terminal, wherein the first input terminal is electrically connected to the first potential supply terminal, wherein the second input terminal is electrically connected to the second potential supply terminal, wherein the voltage divider includes a first resistor and a diode group including diodes of N pieces (N is a natural number) of stages each having an anode and a cathode, wherein an anode of a diode in a first stage is electrically connected to the first potential supply terminal through the first resistor, an anode of a diode in a Kth stage (K is a natural number of any one of 2 to N−1) is electrically connected to a cathode of a diode in a K−1th stage, an anode of a diode in an Nth stage is electrically connected to a cathode of a diode in an N−1th stage, and a cathode of the diode in the Nth stage is electrically connected to the second potential supply terminal, wherein the bypass circuit includes a second resistor, a third resistor, and a transistor including a first terminal serving as a control terminal, a second terminal, and a third terminal, wherein the first terminal of the transistor is electrically connected to one cathode of the diodes in 1 to Kth stages, wherein one of the second terminal and the third terminal of the transistor is electrically connected to the first potential supply terminal through the second resistor, and wherein the other of the second terminal and the third terminal of the transistor is electrically connected to the second potential supply terminal through the third resistor.

20. The semiconductor device according to claim 19, wherein the functional circuit is a photoelectric conversion circuit, wherein the photoelectric conversion circuit includes a photoelectric conversion element whose cathode is electrically connected to the first input terminal, an output resistor, an amplifier circuit, and an output terminal, wherein the amplifier circuit includes a reference transistor including a first terminal serving as a control terminal, a second terminal, and a third terminal and an output transistor group including a first terminal serving as a control terminal, a second terminal, and a third terminal, wherein the first terminal and one of the second terminal and the third terminal of the reference transistor are electrically connected to an anode of the photoelectric conversion element, wherein the other of the second terminal and the third terminal of the reference transistor is electrically connected to the output terminal and is electrically connected to the second input terminal through the output resistor, wherein the first terminal of the output transistor group is electrically connected to the first terminal of the reference transistor, wherein one of the second terminal and the third terminal of the output transistor group is electrically connected to the first input terminal, and wherein the other of the second terminal and the third terminal of the output transistor group is electrically connected to the output terminal and is electrically connected to the second input terminal through the output resistor.

21. The semiconductor device according to claim 19 further comprising a diode including an anode and a cathode, wherein the anode of the diode is electrically connected to the second potential supply terminal, and wherein the cathode of the diode is electrically connected to the first potential supply terminal.

22. The semiconductor device according to claim 19, wherein the transistor is a thin film transistor.

23. The semiconductor device according to claim 19, wherein the transistor is provided over a substrate having an insulating surface.

* * * * *